(12) United States Patent
Ryu et al.

(10) Patent No.: US 10,249,544 B2
(45) Date of Patent: Apr. 2, 2019

(54) METHOD OF INSPECTING SURFACE AND METHOD OF MANUFACTURING SEMICONDUCTOR DEVICE

(71) Applicant: Samsung Electronics Co., Ltd., Suwon-si, Gyeonggi-do (KR)

(72) Inventors: Sung-yoon Ryu, Suwon-si (KR); Chung-sam Jun, Suwon-si (KR); Yu-sin Yang, Seoul (KR); Yun-jung Jee, Seongnam-si (KR); Gil-woo Song, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

(21) Appl. No.: 15/654,899

(22) Filed: Jul. 20, 2017

(65) Prior Publication Data

US 2018/0061718 A1    Mar. 1, 2018

(30) Foreign Application Priority Data

Aug. 26, 2016 (KR) .................. 10-2016-0109331

(51) Int. Cl.
    *H01L 21/00*      (2006.01)
    *H01L 21/66*      (2006.01)
    (Continued)

(52) U.S. Cl.
    CPC .......... *H01L 22/12* (2013.01); *G06K 9/00013* (2013.01); *G06K 9/00624* (2013.01); *G06K 9/2018* (2013.01); *G06K 9/4604* (2013.01); *H01L 21/77* (2013.01); *H01L 22/14* (2013.01); *H01L 22/26* (2013.01); *H01L 22/34* (2013.01)

(58) Field of Classification Search
None
See application file for complete search history.

(56) References Cited

U.S. PATENT DOCUMENTS

| | | |
|---|---|---|
| 5,715,052 A | 2/1998 | Fujino et al. |
| 8,649,591 B2 | 2/2014 | Kaneko et al. |
| | (Continued) | |

FOREIGN PATENT DOCUMENTS

| | | |
|---|---|---|
| JP | 3258821 B2 | 2/2002 |
| KR | 101486271 B1 | 1/2015 |

*Primary Examiner* — Bradley Smith
(74) *Attorney, Agent, or Firm* — Harness, Dickey & Pierce, P.L.C.

(57) ABSTRACT

Provided are a method of inspecting a surface and a method of manufacturing a semiconductor device. The methods include preparing a substrate, selecting a spatial resolution of a first optical device by setting a magnification of an imaging optical system, emitting multi-wavelength light toward a first measurement area of the substrate and obtaining first wavelength-specific images, generating first spectrum data based on the first wavelength-specific images, generating first spectrum data of respective pixels based on the first wavelength-specific images, and extracting a spectrum of at least one first inspection area having a range of the first measurement area or less from the first spectrum data, and analyzing the spectrum. The first optical device includes a light source, an objective lens, a detector, and an imaging optical system. The obtaining first wavelength-specific images includes using the imaging optical system and the detector.

20 Claims, 23 Drawing Sheets

(51) Int. Cl.
*G06K 9/00* (2006.01)
*G06K 9/46* (2006.01)
*H01L 21/77* (2017.01)
*G06K 9/20* (2006.01)

(56) References Cited

U.S. PATENT DOCUMENTS

| | | |
|---|---|---|
| 8,848,185 B2 | 9/2014 | Barak et al. |
| 8,912,495 B2 | 12/2014 | Lange |
| 9,036,895 B2 * | 5/2015 | Sohn ................. G06T 7/001 |
| | | 348/86 |
| 9,198,578 B2 | 12/2015 | Zuzak et al. |
| 2016/0025618 A1 * | 1/2016 | Ryu ................. G01N 21/211 |
| | | 356/369 |
| 2017/0276615 A1 * | 9/2017 | Fresquet ............ G01N 21/9501 |
| 2017/0352599 A1 * | 12/2017 | Park ................. H01L 22/12 |

* cited by examiner

| POSITION | LIGHT INTENSITY DISTRIBUTION COMPENSATION RATIO |
|---|---|
| $P_1(X_1, Y_1)$ | $\Delta I_1$ |
| $P_2(X_1, Y_2)$ | $\Delta I_2$ |
| ⋮ | ⋮ |
| $P_N(X_M, Y_M)$ | $\Delta I_N$ |
| $P_{N-1}(X_{M-1}, Y_M)$ | $\Delta I_{N-1}$ |

METHOD OF INSPECTING SURFACE AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2016-0109331, filed on Aug. 26, 2016, in the Korean Intellectual Property Office, the disclosure of which is incorporated herein in its entirety by reference.

BACKGROUND

1. Field

Inventive concepts relate to a method of inspecting a surface and/or a method of manufacturing a semiconductor device, and more particularly, to a method of inspecting a surface including an operation of inspecting a surface of a micro-area and/or a method of manufacturing a semiconductor device.

2. Description of Related Art

Semiconductor devices may be manufactured by performing numerous (e.g., several hundred) manufacturing processes on a wafer. In this case, a technique in which results of manufacturing processes are rapidly inspected or measured after performing each of the manufacturing processes is used in order to improve a yield and quality of a wafer. In addition, a technique in which a fine pattern or a complex structure is inspected at a high speed is used in accordance with the high integration of recent semiconductor devices.

SUMMARY

Inventive concepts relate to a method of inspecting a surface including an operation of inspecting a micro-area and/or a method of manufacturing a semiconductor device.

According to some example embodiments of inventive concepts, a method of inspecting a surface includes preparing a substrate which is an inspection target, selecting a spatial resolution of a first optical device, emitting multi-wavelength light toward a first measurement area of the substrate, obtaining first wavelength-specific images, generating first spectrum data based on the first wavelength-specific images, extracting a spectrum of at least one first inspection area having a range of the first measurement area or less from the first spectrum data, and analyzing the spectrum. The first optical device includes a light source configured to emit light, an objective lens configured to transmit light received from the light source, a detector, and an imaging optical system configured to image light detected by the detector. The selecting the spatial resolution of the first optical device includes setting a magnification of the imaging optical system. The emitting multi-wavelength light toward the first measurement area of the substrate includes using the light source to emit the multi-wavelength light and the objective lens to transmit the multi-wavelength light received from the light source towards the first measurement area. The obtaining first wavelength-specific images includes the imaging optical system and the detector.

According to some example embodiments of inventive concepts, a method of manufacturing a semiconductor device includes performing a prior manufacturing process on a substrate, and primarily inspecting the substrate using an optical device. The optical device includes a light source configured to emit light, an objective lens configured to transmit light received from the light source, a detector, and an imaging optical system configured to image light detected by the detector. The primarily inspecting of the substrate includes selecting a spatial resolution of the optical device by changing a magnification of the imaging optical system, emitting multi-wavelength light toward a measurement area of the substrate using the light source and the objective lens, and obtaining wavelength-specific images, generating spectrum data of respective pixels based on the wavelength-specific images, extracting a spectrum of at least one inspection area having a range of the measurement area or less from the spectrum data, and analyzing the spectrum of the at least one inspection area.

According to some example embodiments of inventive concepts, a method of manufacturing a semiconductor device includes preparing a substrate including an alignment mark, selecting a spatial resolution of an optical device, emitting light toward an area in which the alignment mark is formed using a light source configured to emit light and an objective lens configured to transmit light received from the light source, obtaining images using the optical device, and aligning the substrate based on the images. The optical device includes the light source, the objective lens, a detector, and an imaging optical system configured to image light detected by the detector. The selecting the spatial resolution of the optical device includes selecting the spatial resolution of the optical device by changing a magnification of the imaging optical system, and the emitting light toward the area in which the alignment mark is formed using the light source and the objective lens. The aligning the substrate includes checking a position of the alignment mark of the substrate based on the images, and moving the substrate so that the alignment mark is aligned with preset coordinates.

According to some example embodiments of inventive concepts, a method of inspecting a surface includes selecting a spatial resolution of a first optical device. The first optical device includes a light source configured to emit light, an objective lens configured to transmit light received from the light source, a detector, and an imaging optical system configured to image light detected by the detector. The selecting the spatial resolution of the first optical device includes setting a magnification of the imaging optical system. The method further includes emitting multi-wavelength light toward a first measurement area of a substrate using the light source to emit the multi-wavelength light and the objective lens to transmit the multi-wavelength light received from the light source towards the first measurement area, obtaining first wavelength-specific images using the imaging optical system and the detector, generating first spectrum data of respective pixels based on the first wavelength-specific images, extracting a spectrum of at least one first inspection area having a range of the first measurement area or less from the first spectrum data, and analyzing the spectrum. The analyzing the spectrum includes one of (i) predicting a 3D structure of the first inspection area based on matching the spectrum of the first inspection area to a spectrum of a reference map, the reference map being generated based on obtaining spectra corresponding to different three dimensional (3D) structures on a test substrate, and (ii) extracting a spectrum of a reference area and a spectrum of the first inspection area from the first spectrum data, and determining if the spectrum of the first inspection area matches the spectrum of the reference area using a spectrum recognition algorithm.

BRIEF DESCRIPTION OF THE DRAWINGS

Some example embodiments of inventive concepts will be more clearly understood from the following detailed description taken in conjunction with the accompanying drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments of inventive concepts will be described in detail with reference to the accompanying drawings.

Figure 1:
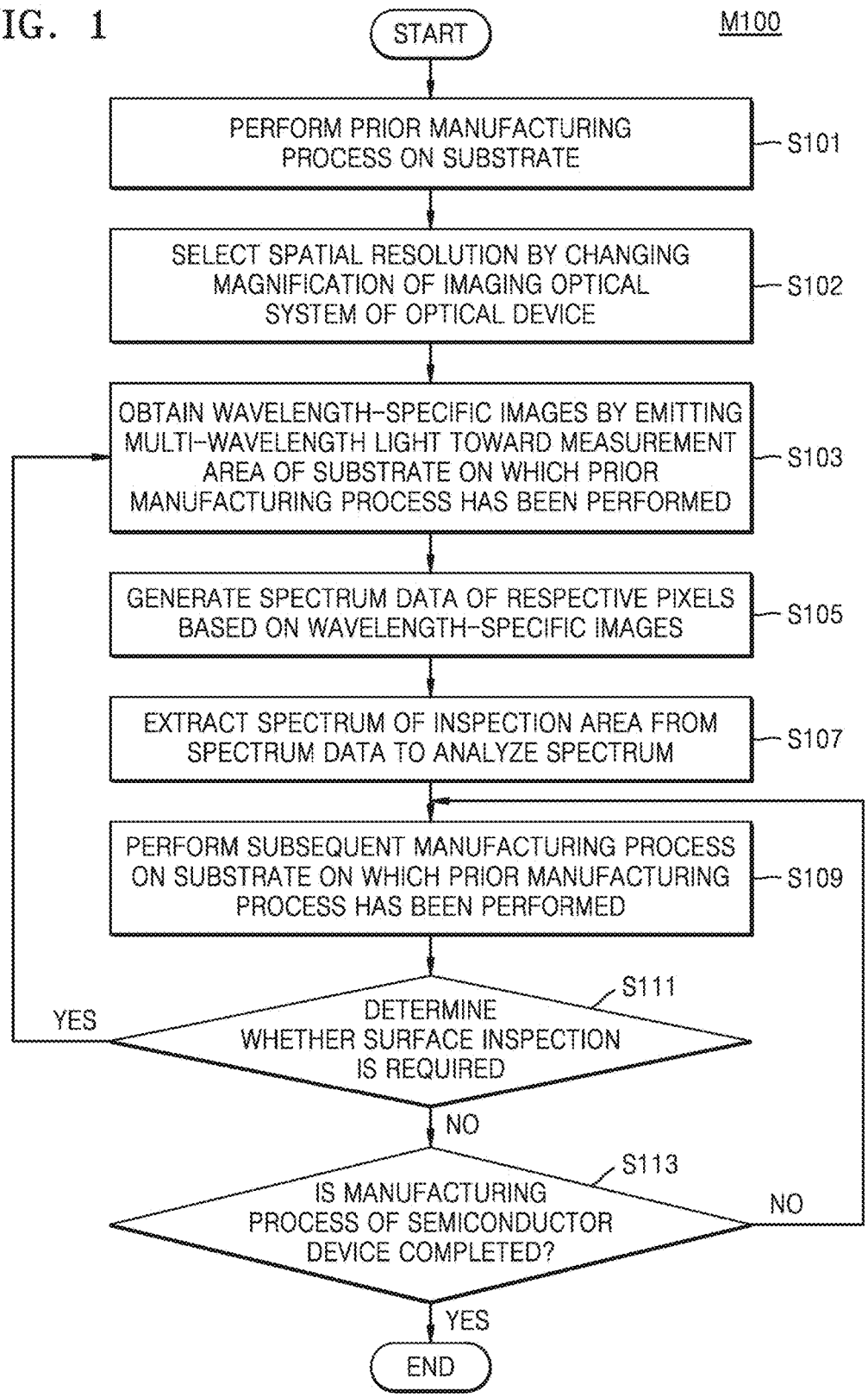
FIG. 1 is a flowchart illustrating a method of manufacturing a semiconductor device according to some example embodiments of inventive concepts.
Figure 2:
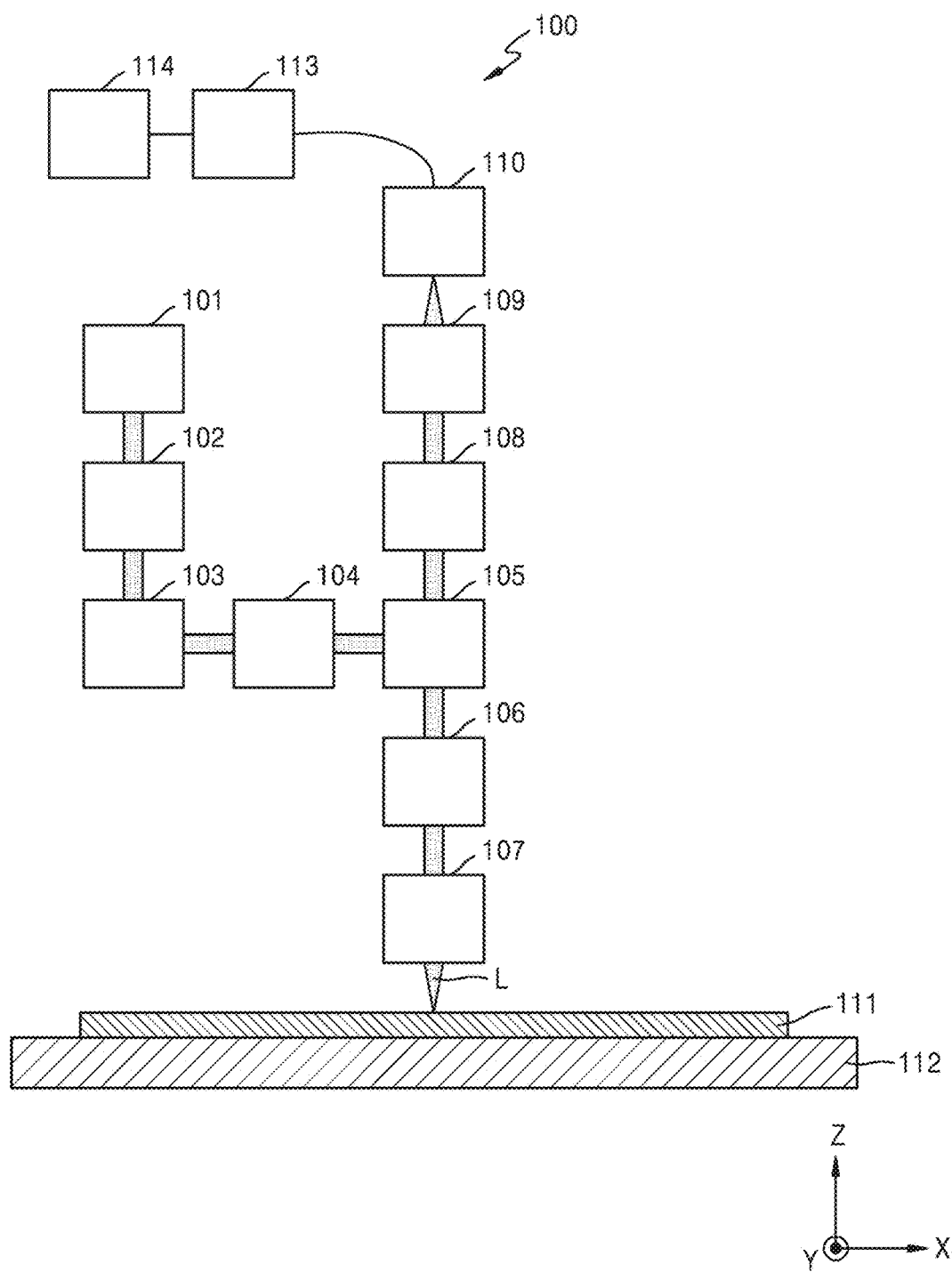
FIG. 2 is a diagram illustrating a schematic configuration of an optical device used in the method of manufacturing the semiconductor device of FIG. 1.
Figure 3:
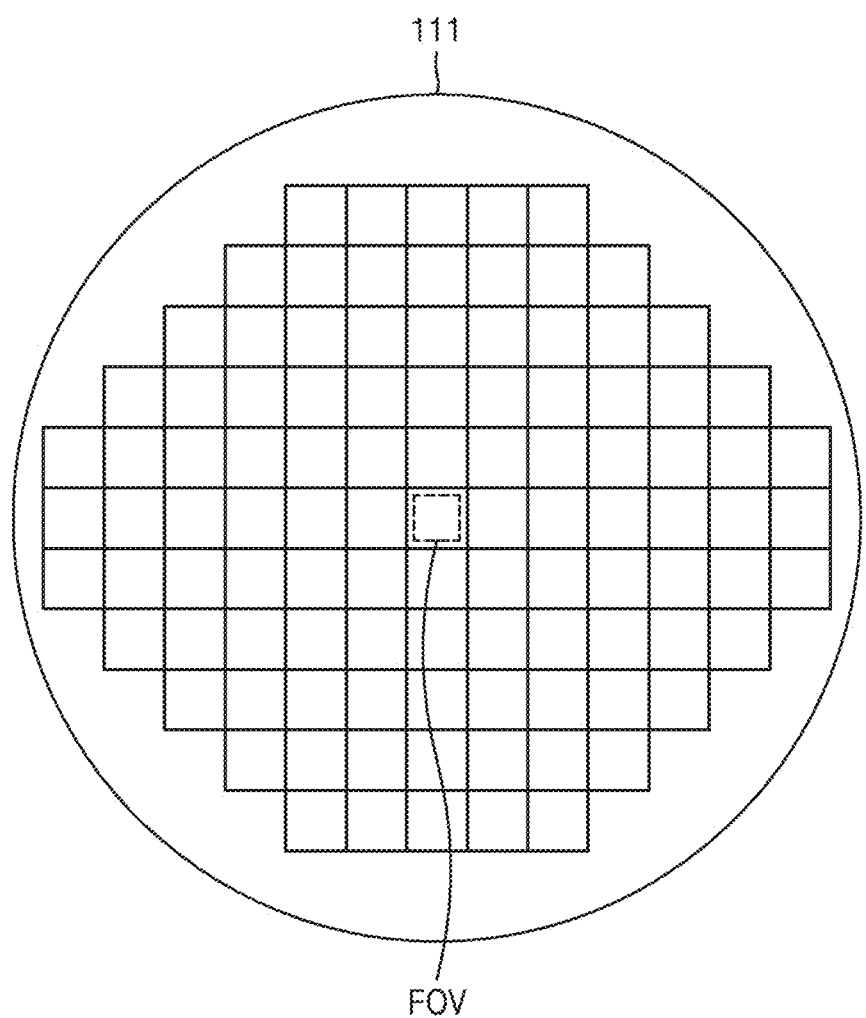
FIG. 3 is a view illustrating a measurement area on a substrate, which is measured by the optical device of FIG. 2.
Figure 4:
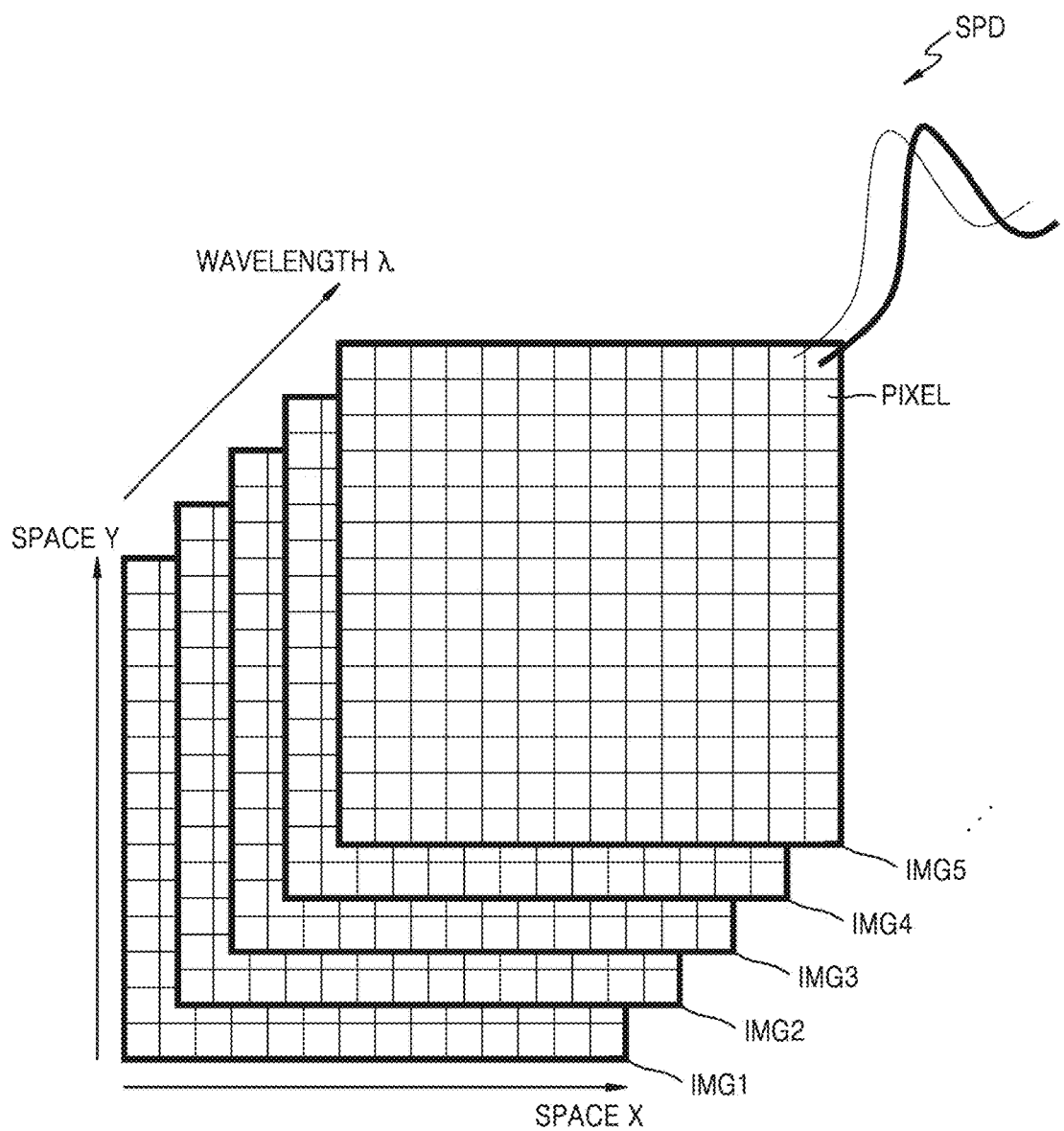
FIG. 4 is a conceptual diagram illustrating wavelength-specific images of the measurement area of FIG. 3 and spectrum data of respective pixels.

FIG. 1 is a flowchart illustrating a semiconductor device manufacturing method M100 according to some example embodiments of inventive concepts. FIG. 2 is a diagram illustrating a schematic configuration of an optical device 100 used in the semiconductor device manufacturing method M100 of FIG. 1. FIG. 3 is a view illustrating a measurement area FOV on a substrate 111, which is measured by the optical device 100 of FIG. 2. FIG. 4 is a conceptual diagram illustrating wavelength-specific images of the measurement area of FIG. 3 and spectrum data of respective pixels based on the wavelength-specific images. The substrate 111 may include a semiconductor wafer.

Referring to FIGS. 1 and 2, a structural change of the substrate 111 (or structural changes of the substrate) may be inspected each time a manufacturing process is completed. Specifically, after a prior manufacturing process is performed on the substrate 111 (S101), inspection may be performed on a surface of the substrate 111 on which the prior manufacturing process has been performed. Chip areas may be formed on the substrate 111 on which the prior manufacturing process has been performed, but inventive concepts are not thereto. The prior manufacturing process may be any process used for manufacturing a semiconductor device, such as a deposition process, a pattern forming process, an etching process, and a cleaning process.

Before performing the inspection, a spatial resolution may be selected by changing (or setting) a magnification of an imaging optical system 109 of the optical device 100 (S102).

The optical device 100 may include a light source 101, a monochrometer 102, an incident optical system 103, an incident polarizer 104, a beam splitter 105, an aperture 106, an objective lens 107, an output polarizer 108, the imaging optical system 109, a detector 110, a stage 112, a signal processor 113, and a signal analyzer 114.

The imaging optical system 109 may be a component for imaging an image of the substrate 111. The imaging optical system 109 may determine a spatial resolution that may be measured based on the magnification thereof. That is, a desired and/or minimum measurable area may be selected by the imaging optical system 109. In this case, the magnification of the imaging optical system 109 may be adjusted to select a desired and/or minimum pixel area of the detector 110 as the desired and/or minimum measurable area. In other example embodiments, the magnification of the imaging optical system 109 may be adjusted to select an area having a light spot size or less as the desired and/or minimum measurable area. The imaging optical system 109 may include at least one lens for adjusting a magnification of light reflected by the substrate 111.

The light source 101 may generate multi-wavelength light having a wide wavelength band, for example, light having a wavelength band of visible light. In this case, a wavelength of visible light may range from 400 nm to 800 nm. The monochromer 102 may alter multi-wavelength light received from the light source 101 to be light having a narrow wavelength band. Specifically, the monochromer 102 may be used to select only a specific wavelength band of multi-wavelength light. The incident optical system 103 may make parallel light by concentrating received light. The incident polarizer 104 may adjust a polarization state of light incident on the substrate 111. The beam splitter 105 may change a direction of light received from the incident polarizer 104 or may pass light reflected by the substrate 111. The aperture 106 may receive light from the beam splitter 105 to control a range of an incidence angle of the light.

The objective lens 107, which is a component which transmits light toward the substrate 111, may change a magnification of an image, which is measured through position adjustment. Meanwhile, when a numerical aperture (NA) of the objective lens 107 is large, a resolution of light may be increased. Conversely, when the NA of the objective lens 107 is small, the resolution may be reduced.

In some example embodiments, after the selecting of the spatial resolution by changing the magnification of the imaging optical system 109 (S102), the method may further include selecting a measurement mode by changing the objective lens 107. Specifically, the selection of the measurement mode may be selecting any one of a first measurement mode having a first NA and a second measurement mode having a second NA smaller than the first NA. The optical device 100 may be driven in the first measurement mode to have a relatively higher resolution than in the second measurement mode. Also referring to FIG. 2, the selection of any one of the first and second measurement modes may be performed in a process of changing the objective lens 107 or changing a shape of the aperture 106.

The measurement mode may be selected from the substrate 111 on the basis of a type of a parameter to be inspected. The parameter may be at least one of uniformity of a film, a thickness of a structure, a width of a structure, an etched depth, a critical dimension, a shape, and a physical property of a film.

In some example embodiments, when the parameter is uniformity of a film, a thickness of a single structure, a width of a single structure, an etched depth of a single hole, a critical dimension of a single structure, or a shape of a single structure, the first measurement mode may be selected. A three-dimensional (3D) structure of a single structure and the like may be accurately imaged in the first measurement mode. In other example embodiments, when the parameter is an arrangement of a plurality of structures, the second measurement mode may be selected. The second measurement mode may have a resolution slightly smaller than that of the first measurement mode, and may address a problem in which images of the plurality of structures are overlapped.

The output polarizer 108 may adjust a polarization state of light reflected by the substrate 111. The incident polarizer 104 and the output polarizer 108 may be selected to respectively have an incident polarization angle and an output polarization angle so as to sensitively react to a target to be detected.

The detector 110 may detect an image because light is imaged by the imaging optical system 109. The stage 112 may support the substrate 111 and may be moved in an X direction, a Y direction, and a Z direction. The signal processor 113 may obtain a signal from the detector 110, and the signal analyzer 114 may receive the signal from the signal processor 113 to analyze the signal. The signal processor 113 may include a central processing unit (CPU), controller, ASIC or other suitable hardware processor and memory.

After the selecting of the spatial resolution (S102), wavelength-specific images IMG1, IMG2, IMG3, IMG4, and IMG5 may be obtained by emitting (and/or directing) multi-wavelength light L toward a first measurement area FOV of the substrate 111 on which the prior manufacturing process has been performed (S103). Specifically, the multi-wavelength light L emitted (and/or directed) toward the substrate 111 may be reflected by the first measurement area FOV, may pass through the imaging optical system 109, and may be incident on the detector 110, and the first measurement area FOV may be shown as the wavelength-specific images IMG1, IMG2, IMG3, IMG4, and IMG5.

In some example embodiments, before the obtaining of the wavelength-specific images IMG1, IMG2, IMG3, IMG4, and IMG5 of the substrate 111 on which the prior manufacturing process has been performed, wavelength-specific base images of the substrate 111 before the prior manufacturing process is performed may be obtained. Next, the wavelength-specific base images may be removed from the wavelength-specific images of the substrate 111 on which the prior manufacturing process has been performed. Accordingly, in the obtaining of the wavelength-specific images of the substrate 111 on which the prior manufacturing process has been performed, an optical interference effect caused by light reflected by structures included in the substrate 111 may be reduced and/or minimized.

The multi-wavelength light L emitted (and/or directed) toward the substrate 111 may be used to represent the structures of the substrate 111 as a high-resolution image by the objective lens 107 having a high NA.

The first measurement area FOV may be a single chip area or a plurality of chip areas according to a range in which the multi-wavelength light L is emitted (and/or directed). The wavelength-specific images IMG1, IMG2, IMG3, IMG4, and IMG5 of the first measurement area FOV may be made with at least one pixel PIXEL. Although not illustrated, in some embodiments, the first measurement area FOV may be an area corresponding to a desired and/or minimum amount of pixels PIXELs of the detector 110. In this case, in the selecting of the spatial resolution (S102), the optical device 100 may be selected so as to have a high spatial resolution by increasing the magnification of the imaging optical system 109.

After the obtaining of the wavelength-specific images IMG1, IMG2, IMG3, IMG4, and IMG5 (S103), spectrum data SPD of respective pixels PIXELs may be generated based on the wavelength-specific images IMG1, IMG2, IMG3, IMG4, and IMG5 (S105). The spectrum data SPD may be image data obtained by the detector 110. The spectrum data SPD may be obtained through a pixel re-sampling process of a spatial area and a spectrum area. The spectrum data SPD may be configured as a plurality of the wavelength-specific images IMG1, IMG2, IMG3, IMG4, and IMG5 according to spatial coordinates, that is, a space X and a space Y, and a wavelength λ as illustrated in FIG. 4. Only five wavelength-specific images IMG1, IMG2, IMG3, IMG4, and IMG5 are illustrated in FIG. 4, but inventive concepts are not thereto.

After the generating of the spectrum data SPD (S105), a spectrum of at least one inspection area having a range of the first measurement area FOV or less may be extracted from the spectrum data SPD to be analyzed (S107). As described above, the spectrum data SPD of the first measurement area FOV may be made with at least one pixel PIXEL. Therefore, a plurality of inspection areas may be areas corresponding to pixels PIXELs. The plurality of inspection areas may be areas corresponding to two or more pixels PIXELs which are spaced apart from each other.

Spectra relatively corresponding to the plurality of inspection areas, which are extracted from the spectrum data SPD, represent information on states of surfaces of the plurality of inspection areas, and the states of the surfaces of the plurality of inspection areas may be predicted by analyzing the spectra.

Figure 7:
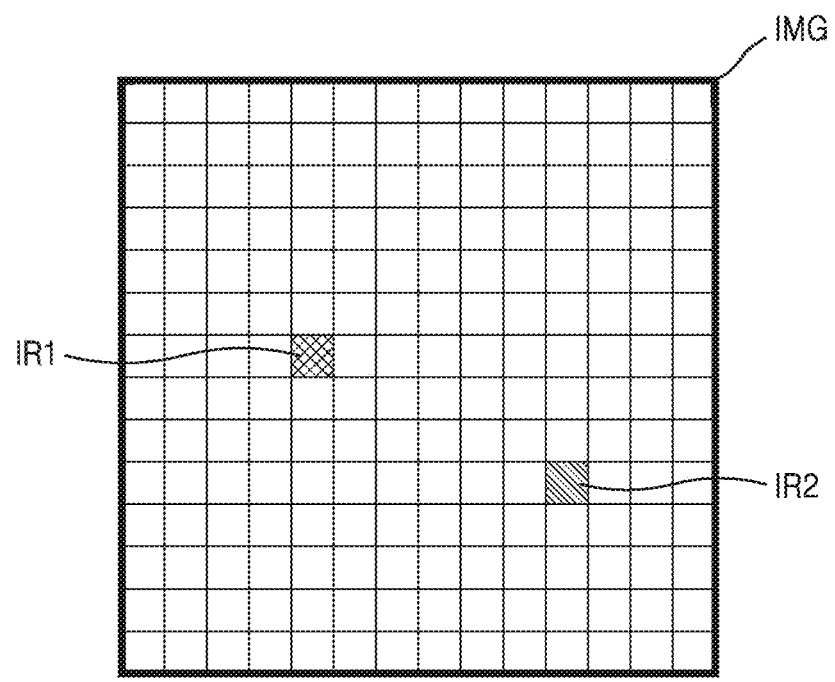
FIG. 7 is a view illustrating arbitrary inspection areas extracted from the measurement area of FIG. 3.

Also referring to FIG. 7, first and second spectra IR1 and IR2 of first and second inspection areas of an image IMG corresponding to a measurement area may be extracted. In this case, the first and second spectra IR1 and IR2 may be displayed on the image IMG with only a wavelength having a maximum light intensity of each of the spectra. Therefore, a state of a surface of each inspection area may be easily checked.

The first and second inspection areas may be areas corresponding to the pixels PIXELs. The first and second inspection areas may be areas corresponding to two pixels PIXELs which are spaced apart from each other.

Then, a subsequent manufacturing process may be performed on the substrate 111 on which the prior manufacturing process has been performed (S109). The subsequent manufacturing process may be any process used for manufacturing a semiconductor device, such as a deposition process, a pattern forming process, an etching process, and a cleaning process.

Then, it may be determined whether it is necessary to perform inspection on the surface of the substrate on which the subsequent manufacturing process has been performed (S111). When it is determined that it is necessary to perform inspection on the surface of the substrate, the inspection may be performed on the surface of the substrate 111 by performing the obtaining of the wavelength-specific images (S103), the generation of the spectrum data of respective pixels (S105), and the extraction and analysis of the spectrum of the inspection area (S107) as described above. In this case, a measurement area of the substrate 111 on which the subsequent manufacturing process has been performed may be the same as the measurement area of the substrate 111 on which the prior manufacturing process has been performed. Accordingly, a structural change of the measurement area may be monitored in the subsequent manufacturing process.

In this way, according to inventive concepts, whether an error is present in the processes may be immediately determined since a semiconductor manufacturing process and a real-time inspection process are performed in real-time, and optimal process conditions during the semiconductor manufacturing process may be derived since an error is appropriately fed back to a manufacturing process facility.

The method of inspecting the surface of the substrate 111 is described as an example of the semiconductor device manufacturing method M100 in FIGS. 1 to 4, but inventive concepts are not thereto. The method of inspecting the surface of the substrate 111 may be used for inspecting a surface of an inspection target rather than that of a semiconductor device.

Figure 5:
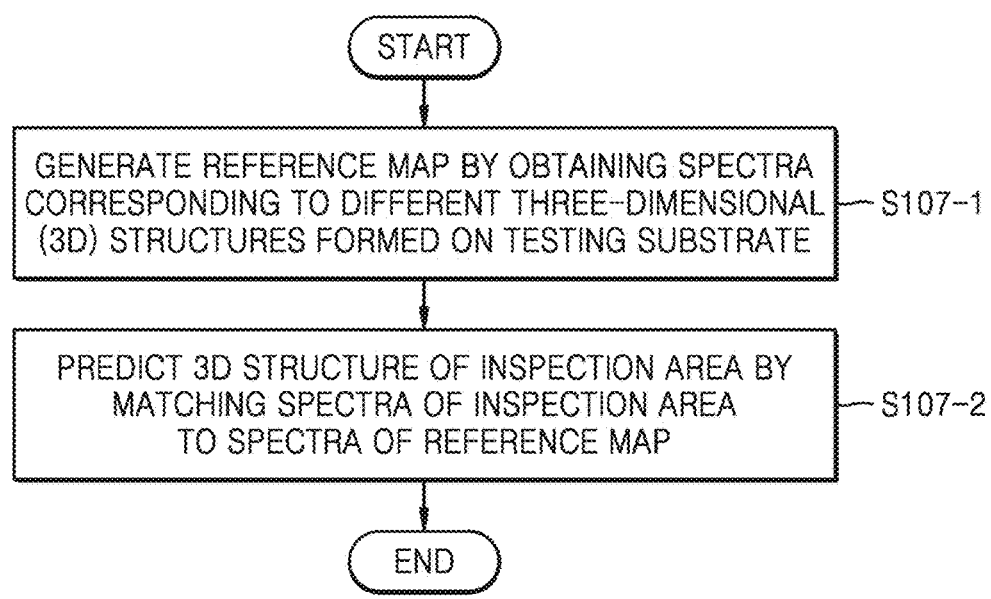
FIG. 5 is a flowchart illustrating an analyzing operation of FIG. 1 in detail.
Figure 6A:
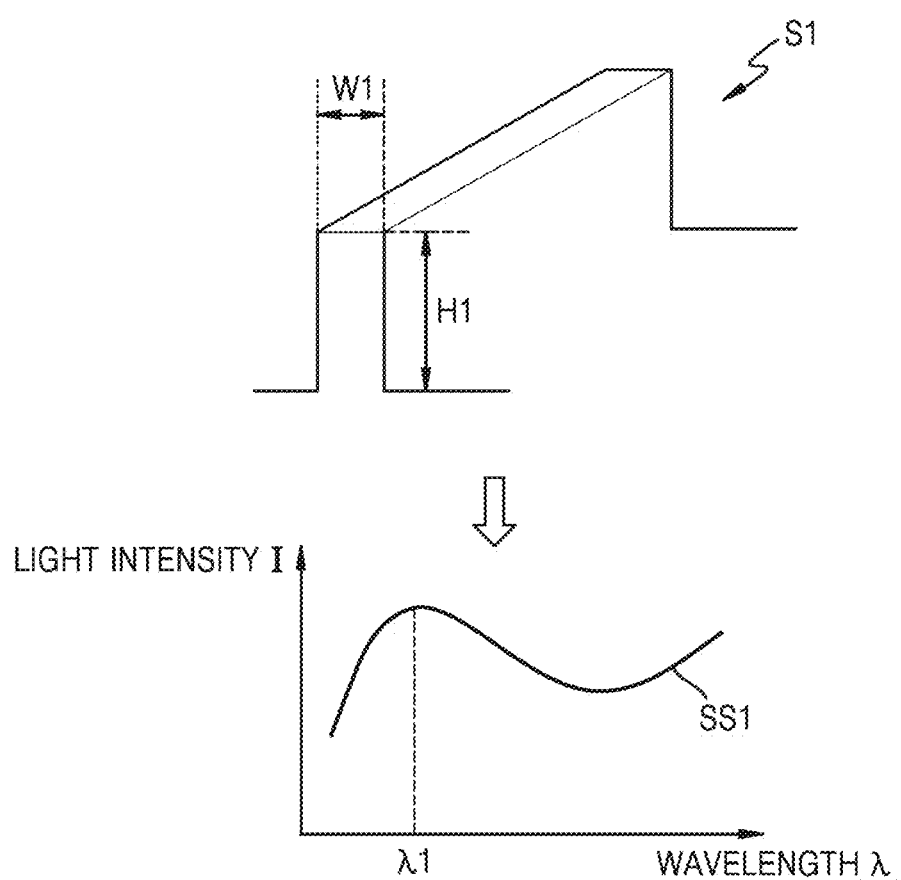
FIGS. 6A and 6B illustrate three-dimensional (3D) structures for describing a principle for generating a reference map of FIG. 5, and spectra corresponding to the 3D structures.
Figure 6B:
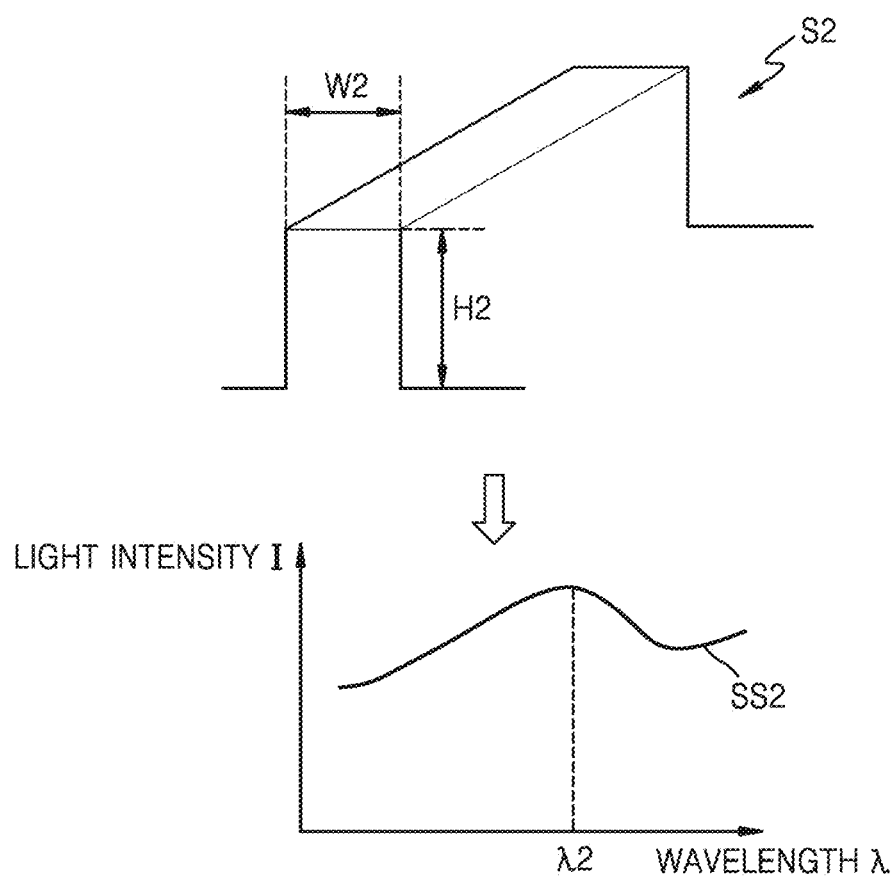

FIG. 5 is a flowchart illustrating the analyzing operation (S107) of FIG. 1 in detail. FIGS. 6A and 6B illustrate 3D structures for describing a principle for generating a reference map of FIG. 5 and spectra corresponding to the 3D structures. FIG. 7 is a view illustrating spectra of arbitrary inspection areas extracted from the measurement area of FIG. 3.

Referring to FIG. 5, the analyzing operation (S107) of FIG. 1 may include generating a reference map (S107-1) and predicting a 3D structure of an inspection area (S107-2).

Also referring to FIGS. 6A and 6B, a reference map may be generated by obtaining spectra SS1 and SS2 respectively corresponding to different 3D structures S1 and S2 formed on a test substrate. For example, a first structure S1 may have a first width W1 and a first height H1, and in this case, a first spectrum SS1 may be obtained by emitting (and/or directing) light toward the first structure S1. In the first spectrum SS1, a light intensity of a first wavelength band λ1 may be largest. Further, a second structure S2 different from the first structure S1 may have a second width W2 and a second height H2, and in this case, a second spectrum SS2 different from the first spectrum SS1 may be obtained by emitting (and/or directing) light toward the second structure S2. In the second spectrum SS2, a light intensity of a second wavelength band X2 different from the first wavelength band X1 may be largest. That is, a 3D structure of the inspection area may be predicted from aspects of the spectra.

FIGS. 6A and 6B are intended to illustrate the reference map, and the reference map is not limited to only the above-described spectra of the structures. The reference map may include spectra of various 3D structures and physical properties.

Also referring to FIG. 7, spectra of a plurality of inspection areas of the first measurement area FOV may be extracted from the spectrum data SPD of FIG. 4, and a 3D structure may be predicted by matching the extracted spectra to the spectra of the reference map. For example, when a spectrum IR1 of a first inspection area matches the first spectrum SS1 of FIG. 6A, it may be predicted that the first inspection area has a surface which is formed to correspond to the first structure S1. In the same manner, when a spectrum IR2 of a second inspection area matches the second spectrum SS2 of FIG. 6B, it may be predicted that the second inspection area has a surface which is formed to correspond to the second structure S2.

The matching of the spectra of the first and second inspection areas to the spectra of the reference map may be performed by an optical critical dimension (OCD) instrument including a spectrum recognition algorithm. The OCD instrument may be included in the signal analyzer 114 of FIG. 2, and may be equipment for extracting a 3D structure from spectrum data. A rigorous coupled-wave analysis (RCWA) algorithm may be used as the spectrum recognition algorithm of the OCD instrument. The RCWA algorithm may be useful in describing diffraction and reflection of an electromagnetic wave from a surface having a lattice structure. Therefore, the spectra of the inspection areas extracted from the spectrum data stored in the signal analyzer 114 may be used for predicting a 3D structure by performing matching of the spectra using the OCD instrument. The signal analyzer 114 may include a central processing unit (CPU), controller, ASIC or other suitable hardware processor and memory for storing instructions, such that when signal analyzer 114 executes the instructions in the memory, the signal analyzer 114 is configured to analyze spectra using the spectrum recognition algorithm (e.g., RCWA) and OCD instrument.

In this way, according to inventive concepts, a plurality of inspection areas may be analyzed by rapidly extracting the plurality of inspection areas from the spectrum data SPD while securing the spectrum data SPD of a relatively wide measurement area FOV by adjusting a position of the objective lens 107. In this case, since a desired and/or minimum measurable area is reduced to a micro-area corresponding to a pixel of the detector 110 by changing the magnification of the imaging optical system 109, a plurality of micro inspection areas may be rapidly extracted and analyzed. Further, the objective lens 107, which is a high magnification objective lens, may analyze a 3D structure at a high resolution.

Meanwhile, also referring to FIG. 2, multi-wavelength light L transmitted from the objective lens 107 toward the measurement area FOV of the substrate 111 may include various angle distributions. In this case, all of the plurality of inspection areas in the measurement area FOV are commonly imaged by the light L, but wavelength-specific light intensity distributions may vary according to a position of an inspection area due to the various angle distributions in the light L. Specifically, referring to FIGS. 9A and 9B, when light having various angle distributions is emitted (and/or directed) to a measurement area of a uniform test substrate 121 without a structural and physical difference according to a position thereof, two inspection areas Pa and Pb of the uniform test substrate 121 may have wavelength-specific light intensity differences $\Delta I$ between spectra Spa and SPb due to the various angle distributions of the light.

Accordingly, the obtaining of the wavelength-specific images (S103) may require correcting a light intensity distribution which is represented in the plurality of inspection areas in the measurement area FOV due to the various angle distributions of the light. The correcting of the light intensity distribution will be described below with reference to FIGS. 8 to 12.

Figure 8:
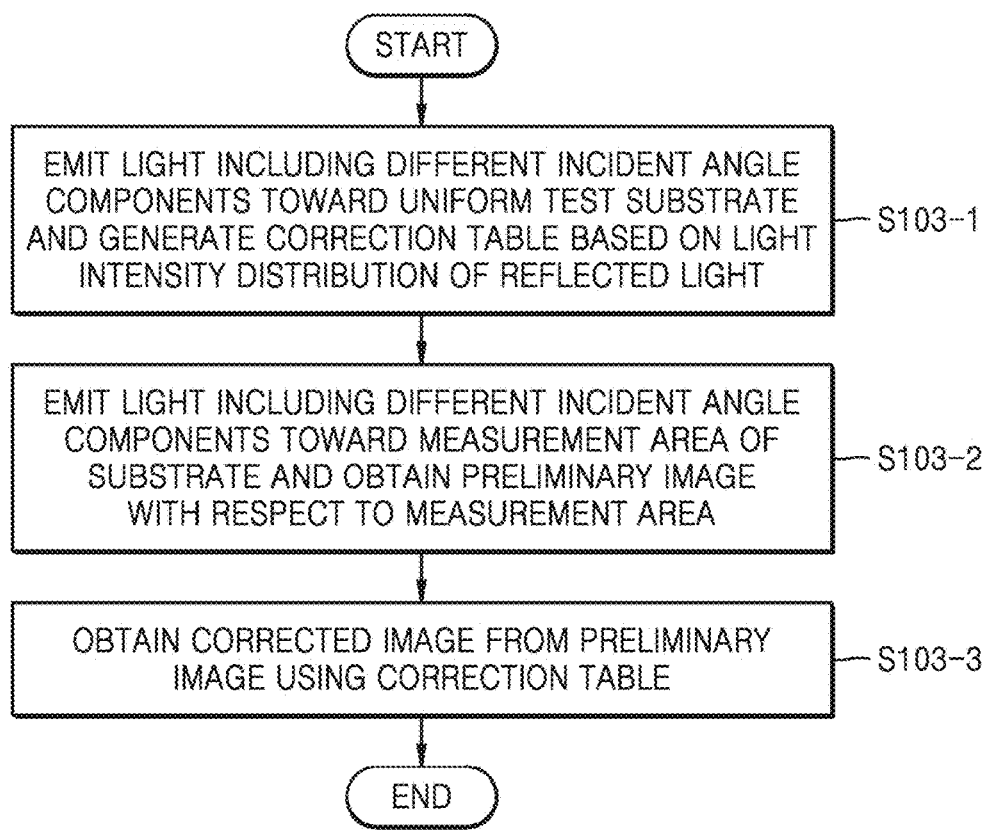
FIG. 8 is a flowchart illustrating a correction operation of a light intensity distribution due to various angle distributions of light according to some example embodiments of inventive concepts.
Figure 9A:
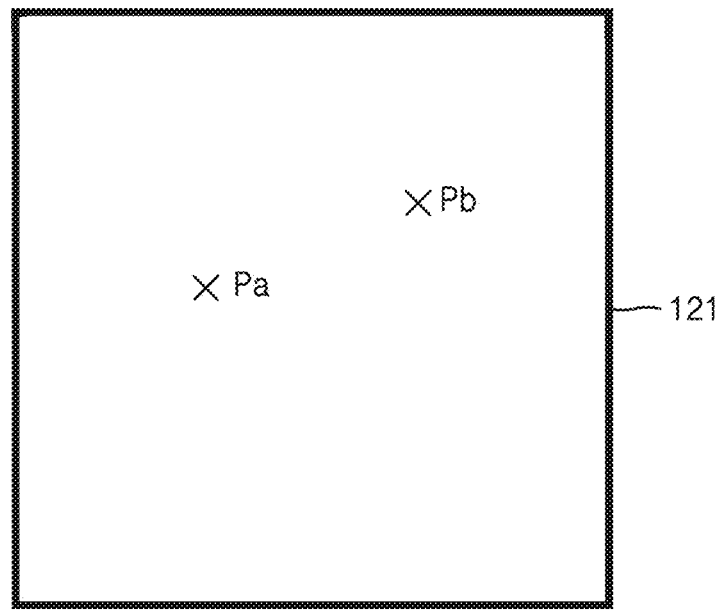
FIGS. 9A and 9B are views illustrating a light intensity difference generated between two points of a uniform substrate due to various angle distributions of light as an object to be addressed by the correction operation of FIG. 8.
Figure 9B:
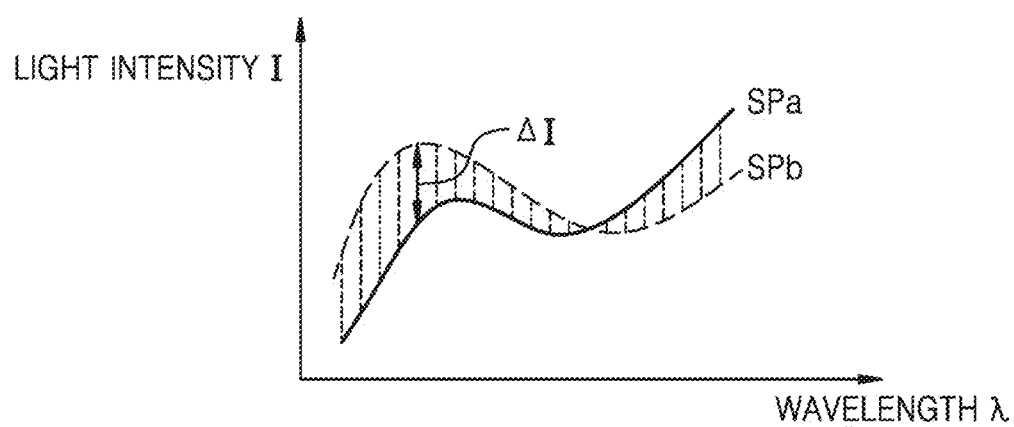

FIG. 8 is a flowchart illustrating a correction operation of a light intensity distribution due to various angle distributions of light as an operation included in the obtaining of the wavelength-specific images (S103) of FIG. 1 according to some example embodiments of inventive concepts. FIGS. 9A and 9B are views illustrating an object to be addressed by the correction operation of FIG. 8 described above.

Referring to FIG. 8, the correction of the light intensity distribution due to the various angle distributions of the light may include emitting (and/or directing) light including various angle distributions toward a uniform test substrate and generating a correction table based on a light intensity distribution of light reflected by the uniform test substrate (S103-1), emitting (and/or directing) light including various angle distributions toward a measurement area and obtaining a preliminary image of the measurement area (S103-2), and correcting the preliminary image using the correction table and obtaining a corrected image (S103-3).

The generating of the correction table (S103-1) will be described below with reference to FIGS. 10A to 12.

Figure 10A:
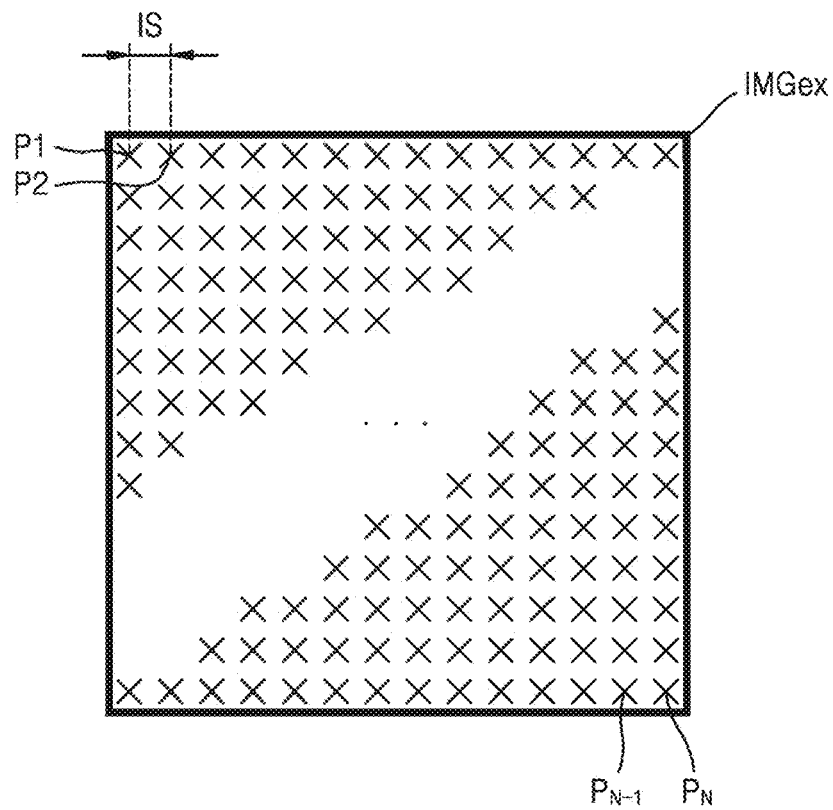
FIGS. 10A and 10B are views illustrating light intensity distributions generated between a plurality of points of a uniform substrate due to various angle distributions of light as a process of generating a correction table of FIG. 8.
Figure 10B:
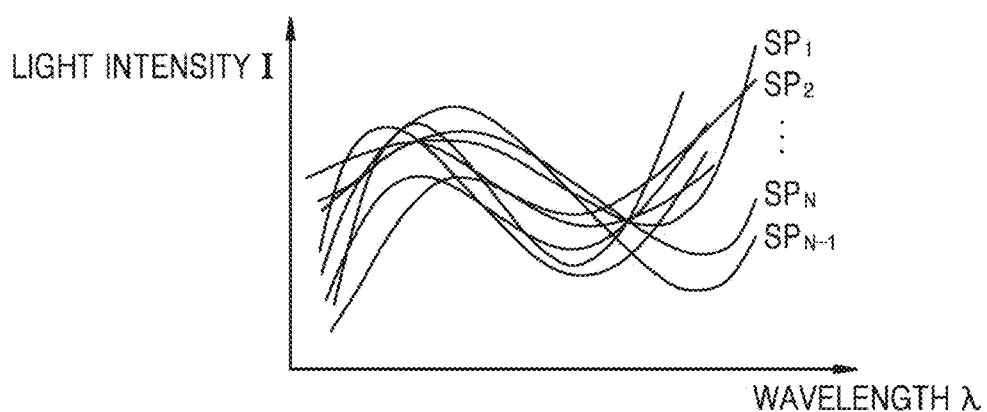
Figures 11, 12:
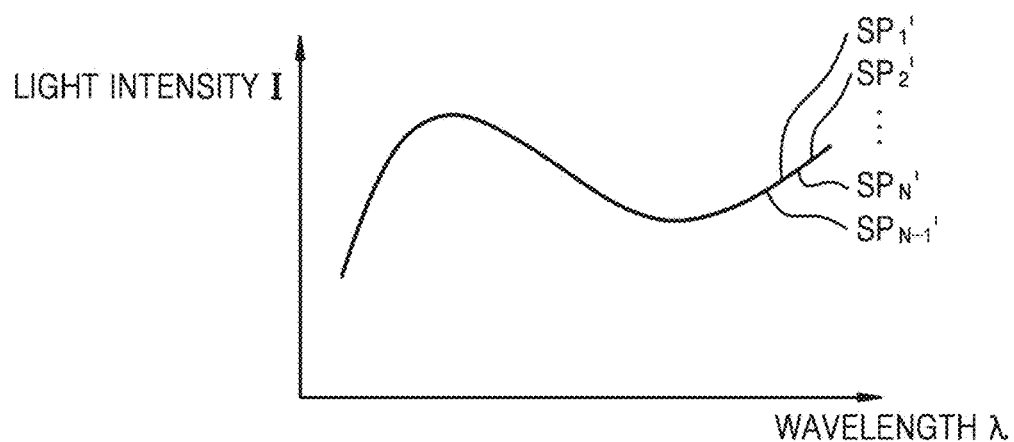
FIG. 11 is a view illustrating the correction table of FIG. 8, wherein the correction table represents a light intensity distribution compensation ratio at each of the plurality of points so that the light intensity distributions at the plurality of points of FIGS. 10A and 10B have a constant light intensity.
FIG. 12 is a graph illustrating a result of correcting the light intensity distributions at a plurality of points using the correction table of FIG. 11.

FIGS. 10A and 10B are views illustrating a light intensity distribution generated between a plurality of points of a uniform substrate due to various angle distributions of light as a process of generating the correction table of FIG. 8. FIG. 11 is a view illustrating the correction table of FIG. 8, wherein the correction table represents a light intensity distribution compensation ratio at each of the plurality of points so that light intensity distributions at the plurality of points of FIGS. 10A and 10B have a constant light intensity. FIG. 12 is a graph illustrating results of correcting the light intensity distributions at the plurality of points using the correction table of FIG. 11.

Referring to FIGS. 10A and 10B, light, which is set to a mode to be used in the obtaining of the wavelength-specific images (S103), may be emitted (and/or directed) toward a measurement area of a uniform test substrate without a structural and physical difference according to a position thereof, and a wavelength-specific image IMGex of the measurement area may be obtained. In this case, the light may include various angle distributions.

Then, spectrum data of respective pixels corresponding to the measurement area may be generated based on the wavelength-specific image IMGex. Next, spectra $SP_1$ to $SP_N$ of a plurality of areas $P_1$ to $P_N$ of the spectrum data may be extracted. Referring to the spectra $SP_1$ to $SP_N$ of the plurality of areas $P_1$ to $P_N$, although the plurality of areas $P_1$ to $P_N$ form uniform surfaces, a difference between wavelength-specific light intensity distributions is generated due to various angle distributions of light.

The plurality of areas $P_1$ to $P_N$ may be unit areas for correcting an intensity of light. Therefore, as distances ISs between the plurality of areas $P_1$ to $P_N$ are reduced, the light intensity may be more precisely corrected. For example, the plurality of areas $P_1$ to $P_N$ may be areas corresponding to pixels of the spectrum data.

Referring to FIG. 11, light intensity distribution compensation ratios $\Delta I_1$ to $\Delta I_N$ may be obtained from the spectra $SP_1$ to $SP_N$ of the plurality of areas $P_1$ to $P_N$, respectively. The light intensity distribution compensation ratios $\Delta I_1$ to $\Delta I_N$ may be wavelength-specific compensation ratios.

Referring to FIG. 12, when the correction table of FIG. 11 is applied to the wavelength-specific spectra $SP_1$ to $SP_N$ of the plurality of areas $P_1$ to $P_N$ of FIG. 10B, since wavelength-specific corrected spectra $SP_1'$ to $SP_N'$ having the same light intensity in the respective plurality of areas $P_1$ to $P_N$ are obtained, usefulness of the correction table may be verified.

Specifically, referring to FIG. 7, wavelength-specific preliminary images may be obtained by emitting (and/or directing) light including various angle distributions toward the measurement area FOV of the substrate 111. Since a difference between the wavelength-specific light intensity distributions is generated in the wavelength-specific preliminary images due to the various angle distributions of light, an error may occur in information on a surface of the measurement area FOV. Therefore, wavelength-specific corrected images may be obtained by compensating for non-uniform light intensity distributions of the wavelength-specific preliminary images using a pre-determined correction table. Accordingly, accurate wavelength-specific images may be obtained by simultaneously obtaining a high-resolution image and suppressing an error from occurring.

Then, corrected spectrum data is generated based on the wavelength-specific corrected images, and a spectrum of at least one inspection area having a range of the first measurement area or less may be extracted and analyzed as described above. In this case, since each of the spectra includes very accurate information on the inspection area through the correction operation, a 3D structure of the inspection area may be analyzed or predicted with high accuracy.

Figure 13:
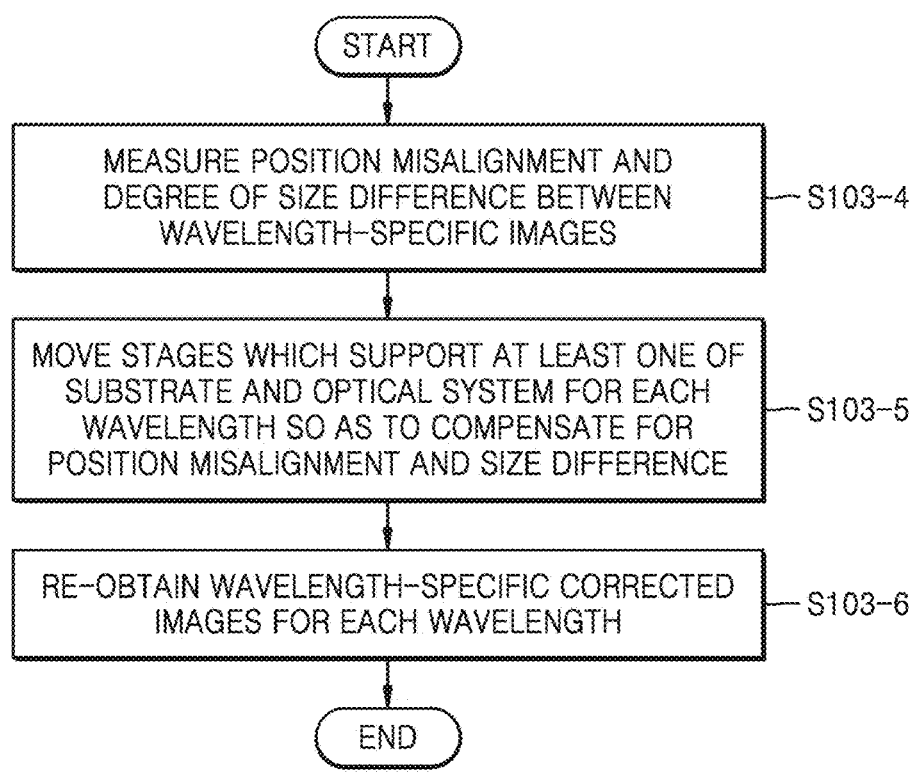
FIG. 13 is a flowchart illustrating a correction operation of a position misalignment and size difference between wavelength-specific images included in an obtaining operation of wavelength-specific images of FIG. 1 according to some example embodiments of inventive concepts.

FIG. 13 is a flowchart illustrating a correction operation of a position misalignment and size difference between the wavelength-specific images caused by a wavelength difference included in the obtaining of the wavelength-specific images (S103) of FIG. 1 according to the some example embodiments of inventive concepts. FIGS. 14A to 14D are views illustrating a problem of a position misalignment and/or size difference between the wavelength-specific images caused by different wavelengths as an object to be addressed by the correction operation of FIG. 13.

First, referring to FIGS. 14A to 14D, first to third images IMG_$\lambda$1 to IMG_$\lambda$3 with respect to first to third wavelength bands $\lambda$1 to $\lambda$3 are represented in a measurement area based on a position and size of a reference image IMG_$\lambda$0 with respect to a reference wavelength band $\lambda$0. The first image IMG_$\lambda$1 with respect to the first wavelength band $\lambda$1 may include a position misalignment compared to the reference image IMG_g. The second image IMG_$\lambda$2 with respect to the second wavelength band $\lambda$2 may include a size difference compared to the reference image IMG_$\lambda$0. The third image IMG_$\lambda$3 with respect to the third wavelength band $\lambda$3 may include a position misalignment and a size difference compared to the reference image IMG_$\lambda$0.

Figure 14A:
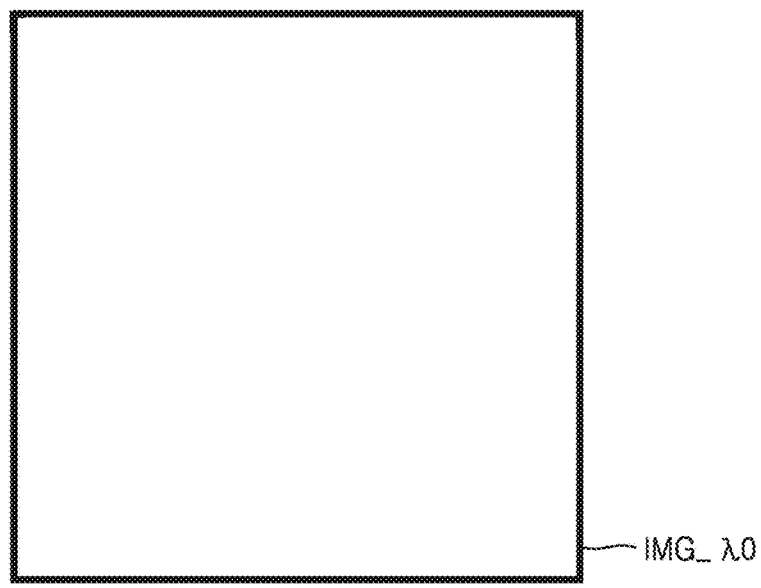
FIGS. 14A to 14D are views illustrating a problem of a position misalignment and/or size difference between wavelength-specific images caused by different wavelengths as an object to be addressed by the correction operation of FIG. 13.
Figure 14B:
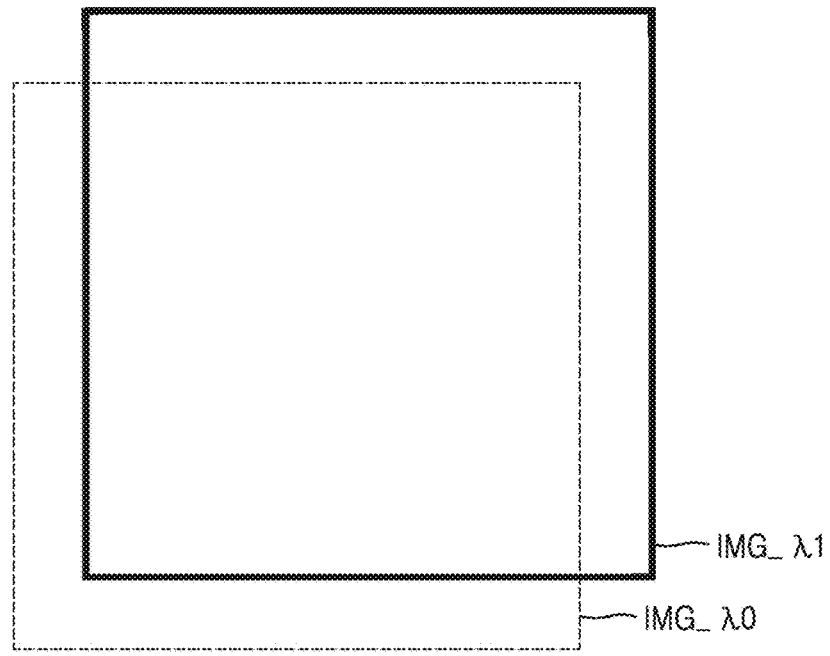
Figure 14C:
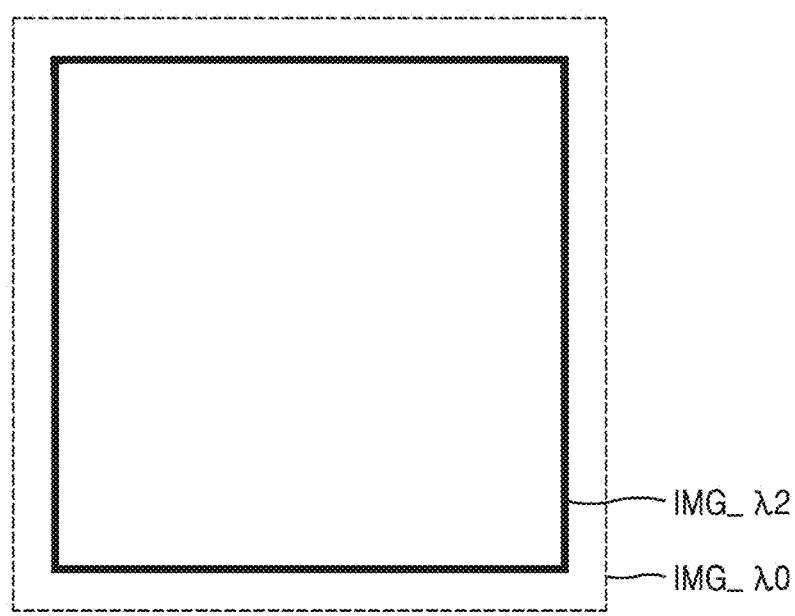
Figure 14D:
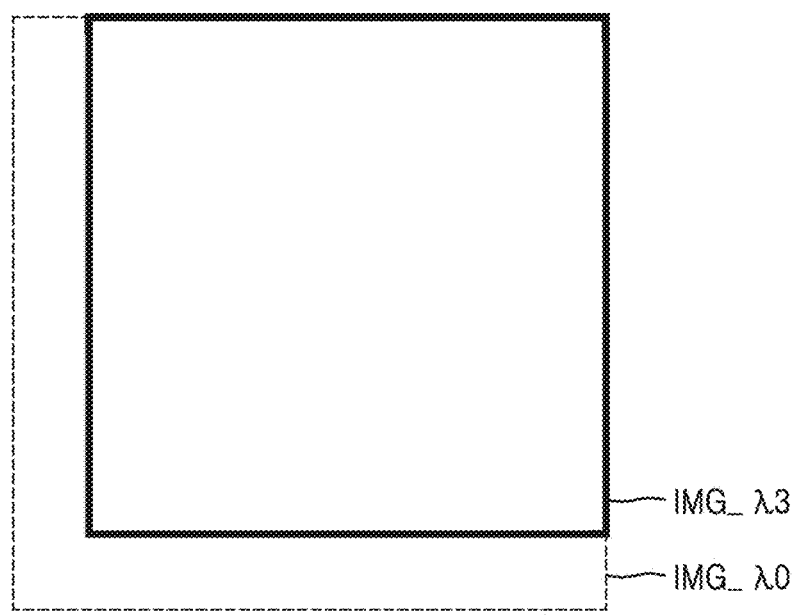

As described above with reference to FIG. 1, when a high-resolution optical device is used to inspect a microarea, errors which are the same as those in FIGS. 14B to 14D may occur in the wavelength-specific images due to changes of an aberration and magnification of an optical system. In this case, since different pieces of wavelength-specific position information are input from a specific pixel of a detector during the generation of the spectrum data based on the wavelength-specific images, there may be a limit in generating wavelength-specific spectra which accurately reflect the measurement area. Therefore, since the obtaining of the wavelength-specific images (S103) includes correcting a position misalignment and size difference between the wavelength-specific images, the same wavelength-specific position information may be input from a specific pixel of the detector.

Specifically, referring to FIG. 13, first, a position misalignment and size difference between wavelength-specific images may be measured based on the wavelength-specific images obtained by imaging the measurement area (S103-4). Then, at least one of the substrate including the measurement area and an optical system may be moved for each wavelength so as to compensate for the position misalignment and size difference between the wavelength-specific images (S103-5). The configuration of the optical device 100 except the stage 112 may be referred to for a configuration of the optical system.

Referring again to FIG. 2, the substrate and/or the optical system may be moved by the stage 112 which supports the substrate 111, or by an optical system stage (not illustrated) which supports the optical system. In this case, the stage 112 and the optical system stage may be moved in the X direction, the Y direction, and the Z direction. The stage 112 and the optical system stage may be horizontally moved to compensate for the position misalignment, and may be vertically moved to compensate for the size difference.

Then, wavelength-specific corrected images may be reobtained for each wavelength (S103-6). Since light for each wavelength reflected at a specific position of the measurement area of the substrate 111 may be detected from the same pixel of the detector 110 due to the compensation of the position misalignment and the size difference, accurate wavelength-specific corrected images and spectrum data generated based on the wavelength-specific corrected images may be obtained.

Then, spectrum data corrected based on the wavelength-specific corrected images may be generated and a spectrum of at least one inspection area having a range of the first measurement area or less may be extracted and analyzed as described above. In this case, since each of the spectra includes accurate surface information on the inspection area due to the correction operation, a 3D structure of the inspection area may be analyzed or predicted with high accuracy.

Figure 15:
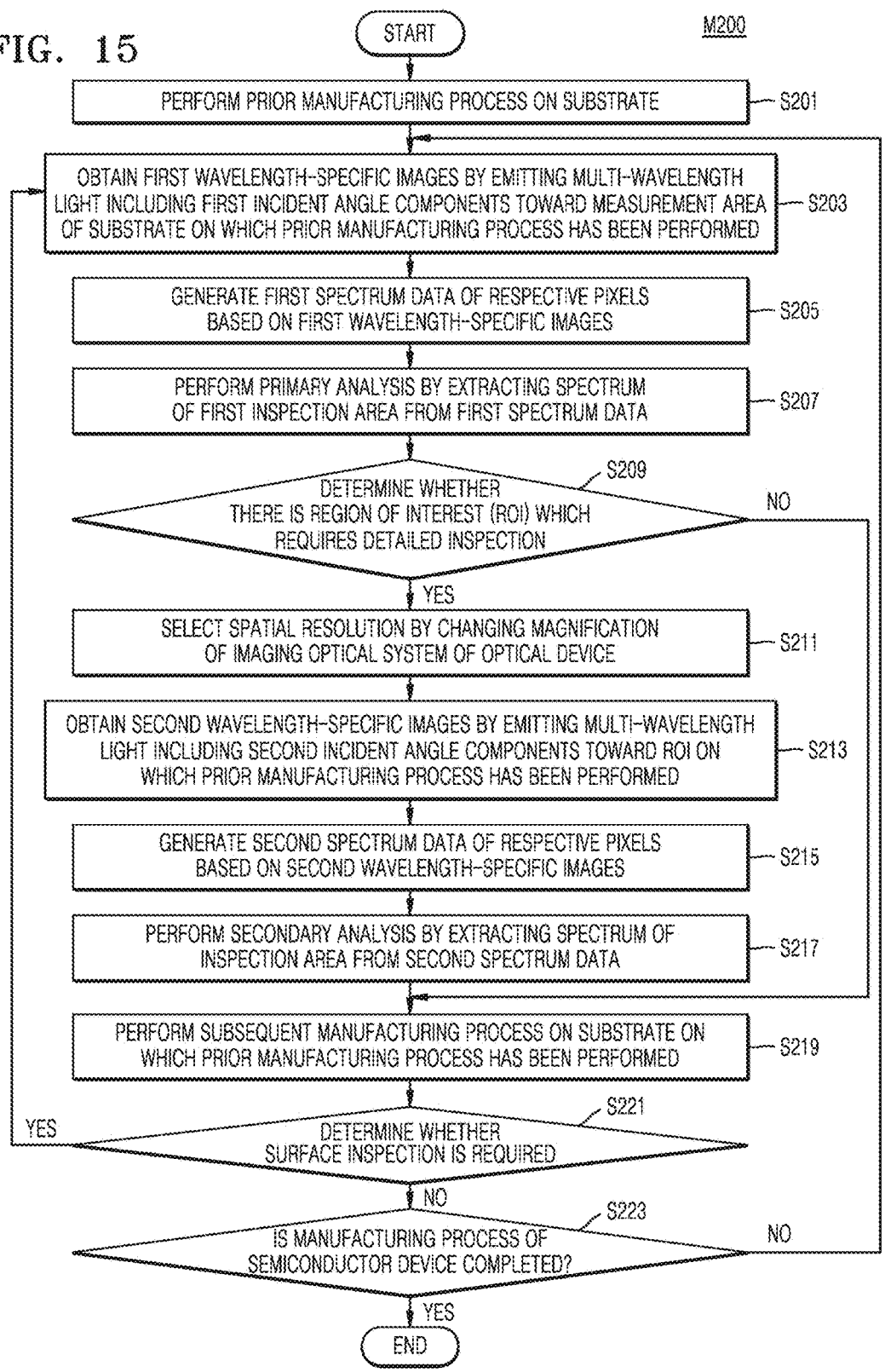
FIG. 15 is a flowchart illustrating a method of manufacturing a semiconductor device according to some example embodiments of inventive concepts.

FIG. 15 is a flowchart illustrating a semiconductor device manufacturing method M200 according to some example embodiments of inventive concepts. The semiconductor device manufacturing method M200 is similar to the semiconductor device manufacturing method M100 described with reference to FIG. 1, but there is a difference in that a primary inspection is performed on a wide measurement area and a secondary inspection is then performed in detail on an area determined as a region of interest (ROI) during the primary inspection. The same operations as those described in the semiconductor device manufacturing method M100 will be briefly described.

Figure 16:
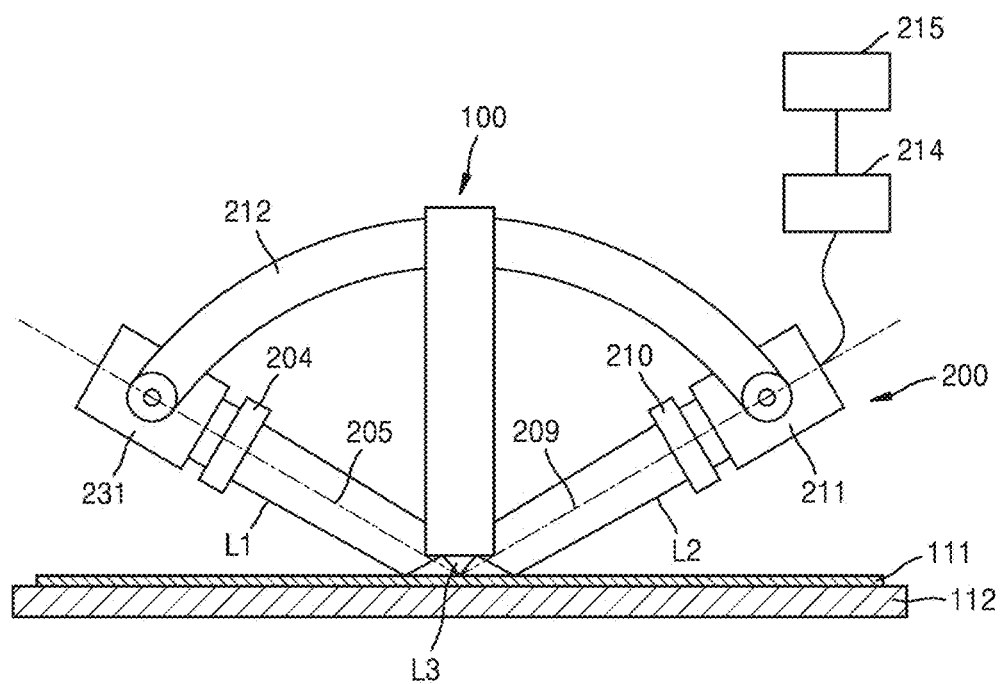
FIG. 16 is a diagram illustrating a schematic configuration of optical devices used in the method of manufacturing the semiconductor device of FIG. 15.
Figure 17:
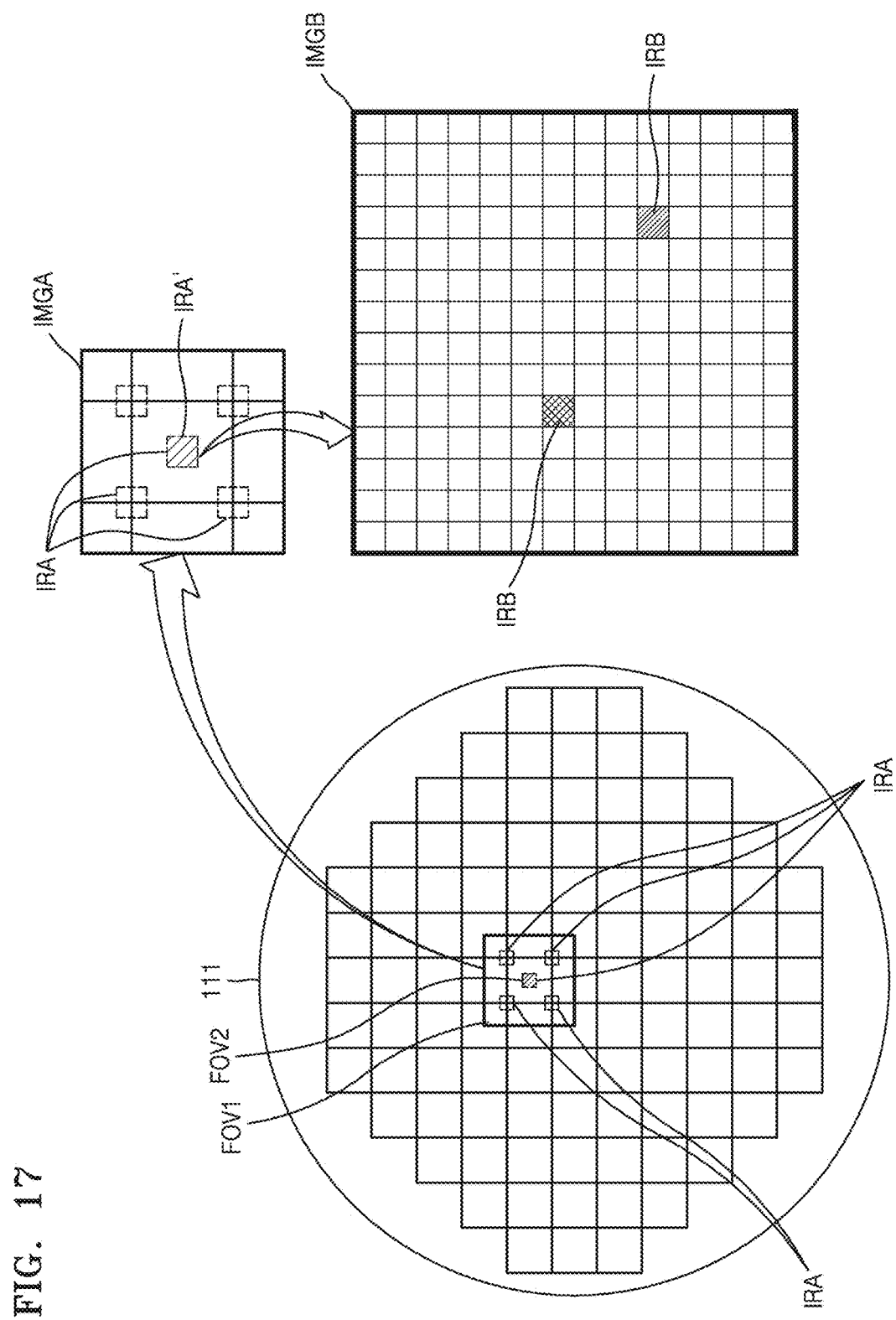
FIG. 17 is a view illustrating a measurement area and an inspection area on a substrate, which is measured by the optical devices of FIG. 16.

FIG. 16 is a diagram illustrating a schematic configuration of optical devices 100 and 200 used in the semiconductor device manufacturing method M200 of FIG. 15. FIG. 17 is a view illustrating a measurement area on a substrate, which is measured by the optical devices of FIG. 16.

Referring to FIGS. 15 and 17, first, a prior manufacturing process may be performed on a substrate 111 (S201). Then, a primary inspection is performed on the substrate 111 on which the prior manufacturing process has been performed using a second optical device 200 of FIG. 16. The primary inspection may include obtaining first wavelength-specific images IMGA by emitting (and/or directing) multi-wavelength light L1 toward a measurement area FOV of the substrate 111 (S203), generating first spectrum data of respective pixels based on the first wavelength-specific images IMGA (S205), and extracting a spectrum of at least one first inspection area IRA from the first spectrum data and primarily analyzing the spectrum (S207).

Also referring to FIG. 16, the first optical device 100 described in FIG. 2 and the second optical device 200 having a maximum measuring range and a resolution different from the first optical device 100 may be used in the primarily analysis of the substrate 111. In this case, the first optical device 100 may be a vertical optical device having an optical axis formed in a direction perpendicular to an upper surface of the stage 112 which supports the substrate 111, and the second optical device 200 may be an inclined optical device having an optical axis formed in a direction inclined to the upper surface of the stage 112, but inventive concepts are not thereto.

The second optical device 200 may have a maximum viewing angle higher than that of the first optical device 100. Accordingly, the second optical device 200 may have a maximum measuring range wider than a maximum measuring range of the first optical device 100. However, a resolution of the second optical device 200 may be lower than a resolution of the first optical device 100.

Specifically, the second optical device 200 may include a light source 231 and an incident-side optical element 204. The light source 231 may emit (and/or direct) multi-wavelength light. The incident-side optical element 204 may be connected to the light source 231. The incident-side optical element 204 may be a lens or a polarizer. Also referring to FIG. 17, light L1 emitted (and/or directed) from the light source 231 may be emitted (and/or directed) toward a first measurement area FOV1 on the substrate 111 placed on the stage 112 passing through the incident-side optical element 204. The incident light L1 may proceed along an optical axis 205 in an incident body (not illustrated).

Further, the second optical device 200 may include an output-side optical element 210 and a detector 211. Reflected light L2 reflected by the substrate 111 may be incident on the detector 211 through the output-side optical element 210. The reflected light L2 may proceed along an optical axis 209 in an output body (not illustrated).

An angle adjuster 212, which may adjust an angle with respect to sensitivity of a measurement area by adjusting an incidence angle of the incident light L1 or a reflected angle of the reflected light L2, may be provided between the incident body and the output body.

The detector 211 may be connected to a signal processor 214 and a signal analyzer 215. The detector 211 may obtain wavelength-specific images using the reflected light L2 reflected by the measurement area on the substrate 111. Further, the signal processor 214 may generate spectrum data of respective pixels based on the wavelength-specific images. After the generated spectrum data is stored in the signal analyzer 215, the generated spectrum data may be used for extracting a spectrum of at least one first inspection area IRA.

Next, whether there is an ROI of the first inspection area IRA that requires detailed inspection may be determined (S209) in the primarily analyzing. The ROI may be an area which is determined as an area having a defect during the analysis of the spectrum. When it is determined that it is necessary to perform a detailed inspection on the ROI, a secondary inspection may be performed on the ROI.

Before performing the secondary inspection, a spatial resolution may be selected by changing a magnification of an imaging optical system of the first optical device 100 for performing the secondary inspection (S211). Accordingly, the first optical device 100 may be set to have a high spatial resolution, and may analyze up to a micro-area in comparison to the second optical device 200 of FIG. 16. Since the first optical device 100 is described above in FIG. 2, a detailed description thereof will be omitted.

Meanwhile, the secondary inspection may include obtaining second wavelength-specific images IMGB by emitting (and/or directing) multi-wavelength light L3 including various angle distributions of light toward the ROI using the first optical device 100 (S213), generating second spectrum data of respective pixels based on the second wavelength-specific images IMGB (S215), and extracting a spectrum of at least one second inspection area IRB from the second spectrum data and secondarily analyzing the spectrum (S217). Since the secondary inspection is performed by the first optical device 100 having a high resolution, defects of the ROI that are found in the second optical device 200 may be more accurately detected. That is, the first inspection area IRA and the ROI IRA' may be smaller than the first measurement area FOV1 in the primary inspection, a measurement area FOV2 in the secondary inspection may have a range similar to that of the ROI, and the second inspection area IRB may be smaller than the ROI.

In this way, since the first spectrum data with respect to a wide surface of the substrate 111 is used in the primary inspection, the inspection may be rapidly performed by extracting a plurality of inspection areas. Further the primary inspection may be reviewed at the same time that an inspection is performed in more detail than the primary inspection on a narrow surface in the secondary inspection. That is, the secondary inspection may be performed in detail on a surface of a micro-area smaller than an ROI, in which it is determined that there is a defect in the primary inspection, as an inspection area.

After the primary and secondary inspections, a subsequent manufacturing process may be further performed on the substrate 111 on which the prior manufacturing process has been performed (S219). Then, whether it is necessary to perform inspection on the surface of the substrate 111 on which the subsequent manufacturing process has been performed may be determined (S221), and when it is determined that the inspection is necessary, the above-described primary and secondary inspections may be performed on the substrate 111 on which the subsequent manufacturing process has been performed.

In this way, according to inventive concepts, whether an error is present in processes may be immediately determined since a semiconductor manufacturing process and a real-time inspection process are performed in real-time, and optimal process conditions during the semiconductor manufacturing process may be derived since an error is appropriately fed back to a manufacturing process facility.

The lights L1, L2, and L3 emitted (and/or directed) from the first and second optical devices 100 and 200 of FIG. 16 are exaggerated for convenience of description, but inventive concepts are not thereto.

Figure 18:
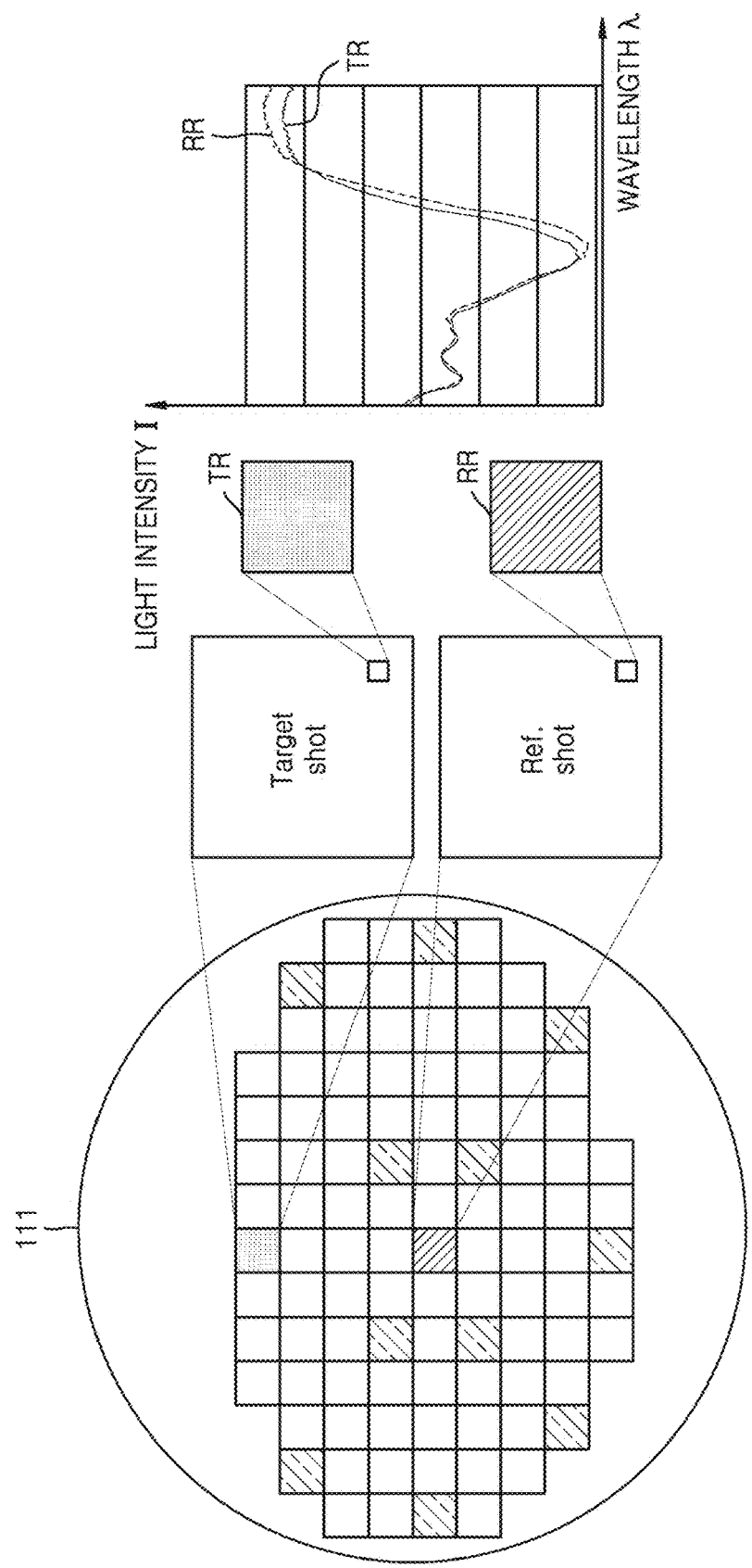
FIG. 18 is a view illustrating an example of an operation in which specific areas of different semiconductor chips on a substrate are inspected using the method of manufacturing the semiconductor device of FIG. 15.

FIG. 18 is a view illustrating an example of an operation in which specific areas of different semiconductor chips on a substrate are inspected using the semiconductor device manufacturing method M200 of FIG. 15.

Referring to FIG. 18, inspection may be performed on a surface of a substrate by comparing a plurality of semiconductor chips. In this case, an area empirically having a small number of defects may be a reference area.

First, a primary inspection may be performed using the second optical device 200 of FIG. 16. That is, first wavelength-specific images including a plurality of semiconductor chips formed on the substrate 111 may be obtained, and first spectrum data of respective pixels may be generated based on the first wavelength-specific images. Then, a reference shot corresponding to the reference area and a target shot corresponding to a target area may be extracted from the first spectrum data to be analyzed.

Next, when it is determined that some areas of the reference shot and the target shot are ROIs which require detailed inspection, a secondary inspection may be performed on the ROIs using the first optical device 100 of FIG. 16.

That is, second wavelength-specific images with respect to each of the reference area and the target area may be obtained, and second spectrum data of respective pixels may be generated based on the second wavelength-specific images. Then, a reference point RR and a target point TR may be extracted from the second spectrum data as second inspection areas to be analyzed.

Whether there is an error at the target point TR may be determined by comparing a spectrum of the target point TR to a spectrum of the reference point RR. Specifically, a detailed 3D structure may be determined using the reference map described with reference to FIG. 4.

Figure 19:
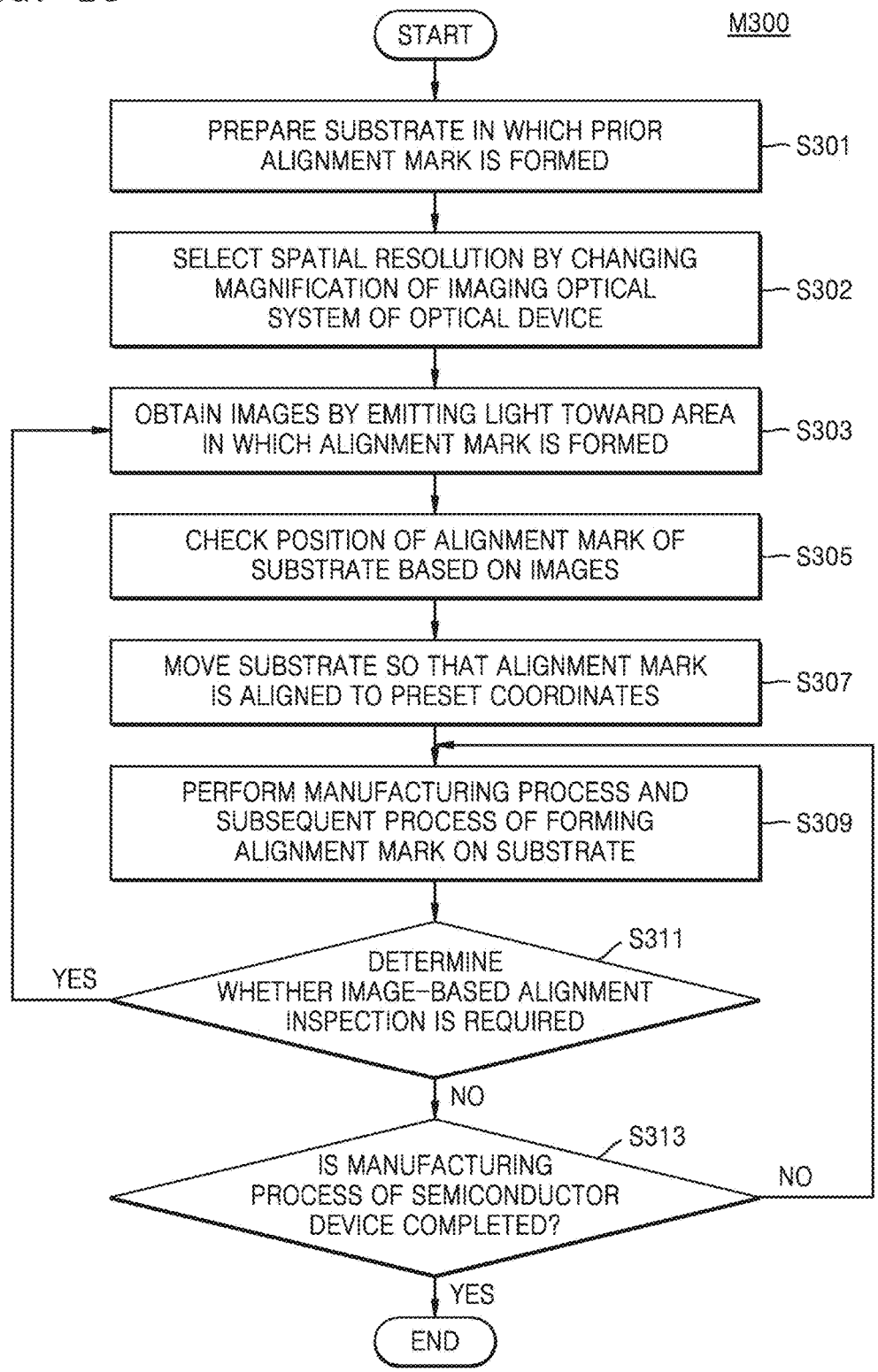
FIG. 19 is a flowchart illustrating a method of manufacturing a semiconductor device according to some example embodiments of inventive concepts.
Figure 20:
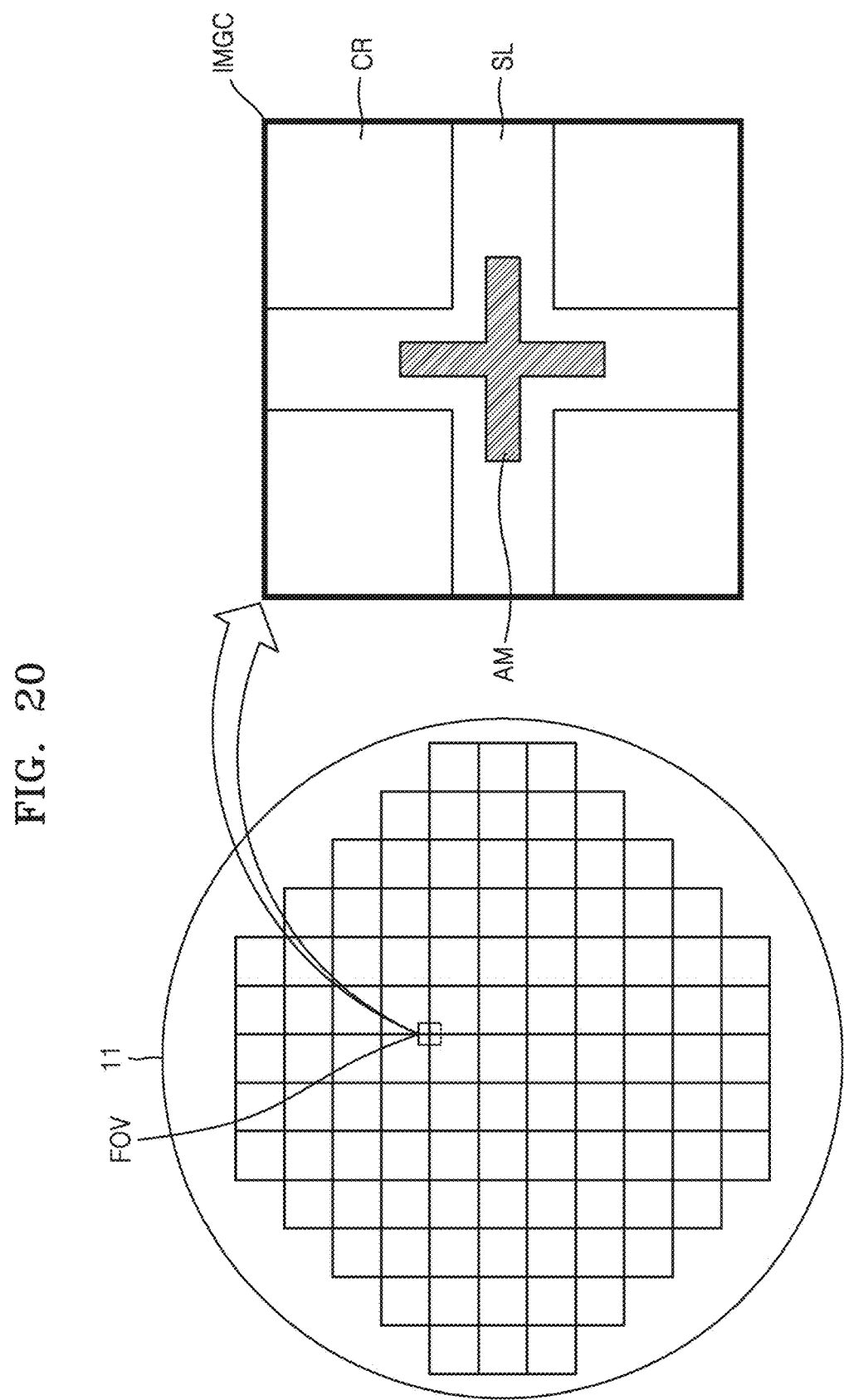
FIG. 20 is a view illustrating an example of an operation in which a substrate is aligned using the method of manufacturing the semiconductor device of FIG. 19.

FIG. 19 is a flowchart illustrating a semiconductor device manufacturing method M300 according to some example embodiments of inventive concepts. The semiconductor device manufacturing method M300 is similar to the semiconductor device manufacturing method M100 of FIG. 1, and there is a difference in that an area adjacent to an alignment mark is extracted from an image obtained by an optical device to be checked in detail and a substrate 11 is aligned. FIG. 20 is a view illustrating an example of an operation in which a substrate is aligned using the semiconductor device manufacturing method M300 of FIG. 19.

Referring to FIGS. 19 and 20, the substrate 11 in which a prior alignment mark AM is formed may be prepared (S301). Then, a spatial resolution may be selected by changing a magnification of the imaging optical system of the optical device 100 of FIG. 2. Accordingly, the optical device 100 may be set to have a high spatial resolution.

Next, light is emitted (and/or directed) toward an area in which the alignment mark AM is formed as a measurement area FOV, and an image IMGC with respect to the measurement area FOV may be obtained (S303). Then, the substrate 11 may be aligned based on the image IMGC.

The alignment of the substrate may include checking a position of the alignment mark AM of the substrate 11 based on the image IMGC (S305), and moving the substrate 11 so that the alignment mark AM is aligned with preset coordinates (S307).

Then, a manufacturing process and a subsequent process of forming an alignment mark may be performed on the substrate 11 (S309), and whether it is required to perform alignment inspection on the substrate 11 on which the manufacturing process has been performed may be determined (S311). When it is determined that an alignment inspection is required, the above-described obtaining of the image (S303), checking of the position of the alignment mark (S305), and moving of the substrate based on the position of the alignment mark (S307) may be performed.

The alignment of the substrate 11 may be continuously performed until the manufacturing process of the semiconductor device is completed (S313). The alignment is illustrated as being performed after the manufacturing process in FIG. 19, but inventive concepts are not thereto. The alignment of the substrate 11 may be before the substrate 11 is processed in an operation of inspecting an electrical characteristic of the semiconductor device, an operation of inspecting a surface of the semiconductor substrate, an operation using a stepper for performing a photolithography process, and an operation using another substrate processing facility, in order for the substrate 11 to be positioned at a predetermined position inside a device.

In this way, in the semiconductor device manufacturing method M300 according to inventive concepts, since the spatial resolution is selected according to the magnification of the imaging optical system 109 of the optical device 100 of FIG. 2 and an accurate position may be secured by selectively extracting an area in which the alignment mark AM is positioned from the obtained image to be analyzed, the substrate 11 may be accurately aligned during the manufacturing process and the inspection process.

Figure 21A:
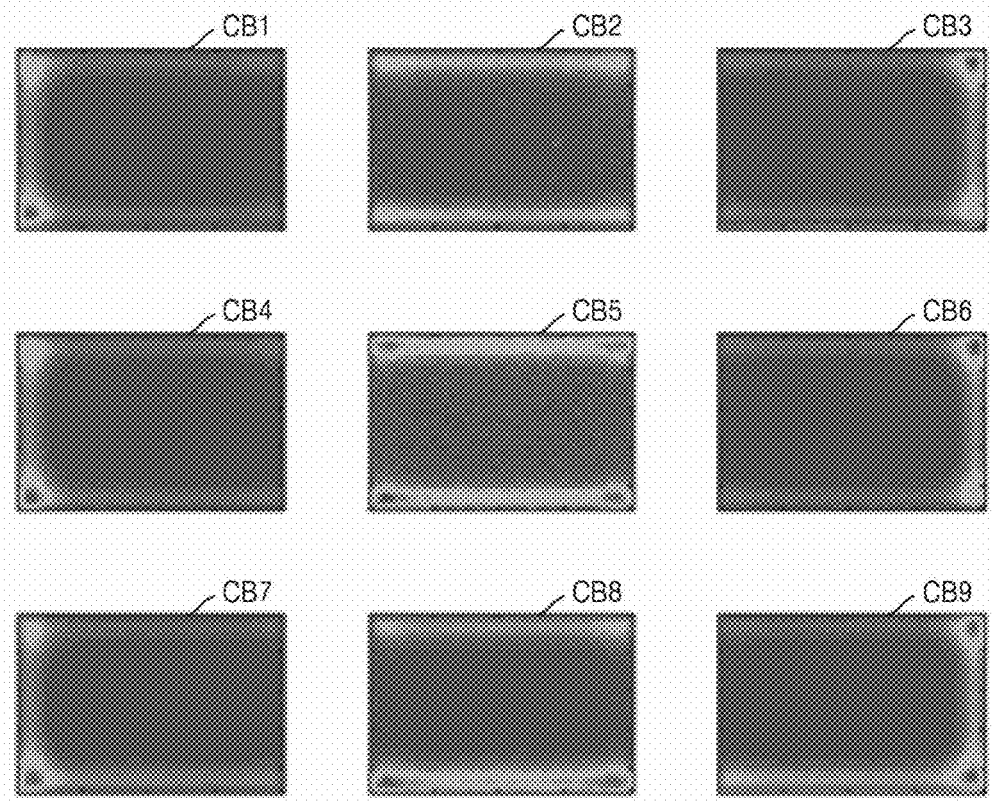
FIGS. 21A and 21B are views illustrating results of inspecting thickness uniformity at a plurality of cell block points of a semiconductor device using the method of manufacturing the semiconductor device according to the some example embodiments of inventive concepts.
Figure 21B:
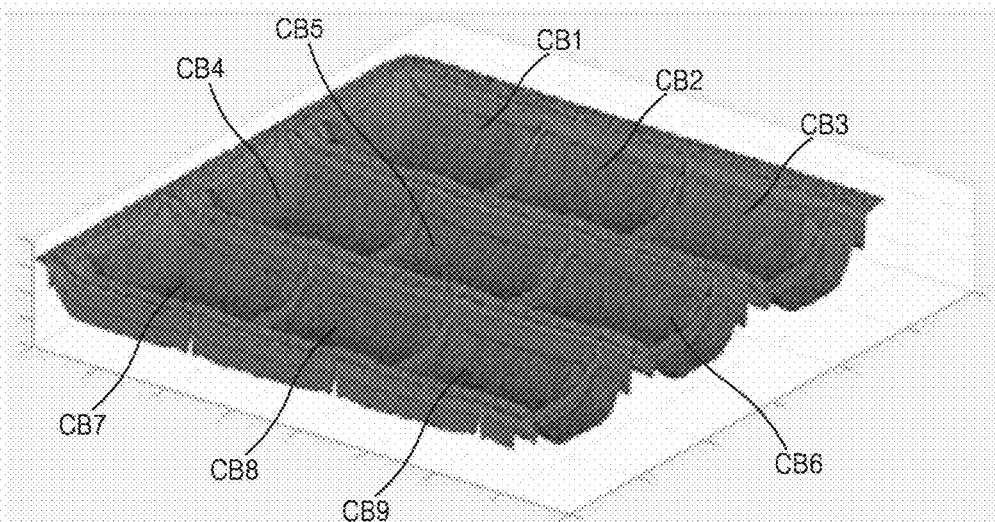

FIGS. 21A and 21B are views illustrating results of inspecting thickness uniformity at a plurality of cell block positions of a semiconductor device using the methods of manufacturing the semiconductor device according to some example embodiments of inventive concepts.

Referring to FIGS. 21A and 21B, the inspection of the surface described with reference to FIGS. 1 to 18 may be performed on a substrate including a plurality of cell blocks.

After wavelength-specific images are obtained from an area including nine cell block areas CB1 to CB9 of the substrate as a measurement area, spectrum data may be generated based on the wavelength-specific images. Then, a spectrum of each of the nine cell block areas CB1 to CB9 may be extracted from the spectrum data. The inspection is performed by an optical device which may set a pixel area of a detector to a desired and/or minimum measurement area as described above.

Therefore, each of the nine cell block areas CB1 to CB9 may be analyzed by spectra of a plurality of pixel areas. For example, a first cell block area CB1 shows the same wavelength band over a wide area in a center portion and a right portion. On the other hand, a wavelength band different from the wavelength bands in the center portion and the right portion is shown in a left portion, and various wavelength bands are shown in the left portion. Therefore, while the center and right portions of the first cell block area CB1 have a uniform thickness, thickness uniformity in the left portion thereof may be analyzed as being reduced.

In this way, thickness uniformity between the nine cell block areas CB1 to CB9 may be analyzed. That is, in the inspection according to inventive concepts, inspection areas distributed over a wide area may be rapidly inspected in detail.

FIG. 21B is a view illustrating the extracted nine cell block areas CB1 to CB9 in FIG. 21A as a single image. Since the extracted nine cell block areas CB1 to CB9 are represented as having different wavelength bands according to a 3D structure in FIG. 21B, the thickness uniformity between the nine cell block areas CB1 to CB9 may be easily checked.

While embodiments have been particularly shown and described with reference to exemplary embodiments thereof, those of ordinary skill in the art should understand that various changes in form and details may be made therein without departing from the spirit and scope of embodiments as defined by the following claims.

What is claimed is:

1. A method of inspecting a surface, the method comprising:
preparing a substrate which is an inspection target;
selecting a spatial resolution of a first optical device,
the first optical device including a light source configured to emit light, an objective lens configured to transmit light received from the light source, a detector, and an imaging optical system configured to image light detected by the detector,
the selecting the spatial resolution of the first optical device including setting a magnification of the imaging optical system;
emitting multi-wavelength light toward a first measurement area of the substrate using the light source to emit the multi-wavelength light and the objective lens to transmit the multi-wavelength light received from the light source towards the first measurement area;
obtaining first wavelength-specific images using the imaging optical system and the detector;
generating first spectrum data of respective pixels based on the first wavelength-specific images;
extracting a spectrum of at least one first inspection area having a range of the first measurement area or less from the first spectrum data; and
analyzing the spectrum.

2. The method of claim 1, wherein
the analyzing of the spectrum includes predicting a three dimensional structure of the first inspection area based on matching the spectrum of the first inspection area to a spectrum of a reference map, and
the reference map is generated based on obtaining spectra corresponding to different three dimensional structures on a test substrate.

3. The method of claim 1, wherein the obtaining the first wavelength-specific images includes correcting light intensity distributions due to various angle distributions of the multi-wavelength light.

4. The method of claim 1, wherein the multi-wavelength light is emitted having an optical axis in a direction perpendicular to an upper surface of the substrate.

5. The method of claim 1, wherein the obtaining of the first wavelength-specific images comprises correcting a position misalignment and size difference which occur between the first wavelength-specific images due to different wavelengths.

6. The method of claim 1, further comprising:
selecting a measurement mode before the obtaining of the first wavelength-specific images, wherein
the selecting the measurement mode includes selecting any one of a first measurement mode having a first numerical aperture and a second measurement mode having a second numerical aperture smaller than the first numerical aperture based on a type of a parameter to be inspected in the first inspection area.

7. The method of claim 1, wherein the first inspection area is a plurality of first inspection areas that are spaced apart from each other.

8. The method of claim 1, wherein the analyzing of the spectrum includes:
extracting a spectrum of a reference area and a spectrum of the first inspection area from the first spectrum data; and
comparing the spectrum of the first inspection area to the spectrum of the reference area.

9. The method of claim 1, further comprising:
previously analyzing the substrate before the selecting of the spatial resolution of the first optical device, wherein
the previously analyzing of the substrate includes,
emitting multi-wavelength light toward a second measurement area of the substrate using a second optical device and obtaining second wavelength-specific images,
generating second spectrum data of respective pixels based on the second wavelength-specific images,
extracting a spectrum of at least one second inspection area from the second spectrum data and previously analyzing the spectrum of the at least one second inspection area, and
determining whether there is a region of interest, which requires detailed inspection, in the second inspection area in the previously analyzing of the substrate, and
the region of interest is the first measurement area.

10. A method of manufacturing a semiconductor device, the method comprising:
performing a prior manufacturing process on a wafer;
primarily inspecting the wafer according to the method of claim 1, the substrate including the wafer and the surface; and
performing a subsequent manufacturing process on the substrate after the primarily inspecting the wafer.

11. A method of manufacturing a semiconductor device, the method comprising:
performing a prior manufacturing process on a substrate; and
primarily inspecting the substrate using an optical device, the optical device including a light source configured to emit light, an objective lens configured to transmit light received from the light source, a detector, and an imaging optical system configured to image light detected by the detector,
the primarily inspecting the substrate includes selecting a spatial resolution of the optical device by changing a magnification of the imaging optical system, emitting multi-wavelength light toward a measurement area of the substrate using the light source and the objective lens, and obtaining wavelength-specific images, generating spectrum data of respective pixels based on the wavelength-specific images, extracting a spectrum of at least one inspection area having a range of the measurement area or less from the spectrum data, and analyzing the spectrum of the at least one inspection area.

12. The method of claim 11, wherein the obtaining the wavelength-specific images includes correcting optical interference caused by the substrate before the prior manufacturing process is performed.

13. The method of claim 12, wherein the correcting the optical interference includes:
obtaining wavelength-specific base images of the substrate before the prior manufacturing process is performed; and
removing the wavelength-specific base images from the wavelength-specific images.

14. The method of claim 11, further comprising:
performing a subsequent manufacturing process on the substrate after the primarily inspecting of the substrate;
determining whether it is necessary to perform inspection on the substrate on which the subsequent manufacturing process is performed; and
secondarily inspecting the substrate on which the subsequent manufacturing process is performed in response to determining that the inspection is necessary, the secondarily inspecting the substrate being performed using the same method as the primarily inspecting the substrate.

15. The method of claim 11, further comprising:
aligning the substrate based on the wavelength-specific images, wherein the aligning of the substrate includes checking a position of an alignment mark of the substrate based on an image with respect to at least one wavelength of the wavelength-specific images, and
moving the substrate so that the alignment mark is aligned with preset coordinates.

16. The method of claim 11, further comprising:
performing a subsequent manufacturing process on the substrate after the primarily inspecting the substrate.

17. A method of inspecting a surface, the method comprising:
selecting a spatial resolution of a first optical device,
the first optical device including a light source configured to emit light, an objective lens configured to transmit light received from the light source, a detector, and an imaging optical system configured to image light detected by the detector,
the selecting the spatial resolution of the first optical device including setting a magnification of the imaging optical system;
emitting multi-wavelength light toward a first measurement area of a substrate using the light source to emit the multi-wavelength light and the objective lens to transmit the multi-wavelength light received from the light source towards the first measurement area;
obtaining first wavelength-specific images using the imaging optical system and the detector;
generating first spectrum data of respective pixels based on the first wavelength-specific images;
extracting a spectrum of at least one first inspection area having a range of the first measurement area or less from the first spectrum data; and
analyzing the spectrum, the analyzing the spectrum including one of,
predicting a three dimensional structure of the first inspection area based on matching the spectrum of the first inspection area to a spectrum of a reference map, the reference map being generated based on obtaining spectra corresponding to different three dimensional structures on a test substrate, and extracting a spectrum of a reference area and a spectrum of the first inspection area from the first spectrum data, and determining if the spectrum of the first inspection area matches the spectrum of the reference area using a spectrum recognition algorithm.

18. The method of claim 17, wherein the analyzing of the spectrum includes the predicting a three dimensional structure of the first inspection area based on matching the spectrum of the first inspection area to a spectrum of a reference map, and the reference map is generated based on obtaining spectra corresponding to different three dimensional structures on a test substrate.

19. The method of claim 17, wherein the analyzing of the spectrum includes extracting the spectrum of the reference area and the spectrum of the first inspection area from the first spectrum data, and determining if the spectrum of the first inspection area matches the spectrum of the reference area using the spectrum recognition algorithm.

20. A method of manufacturing a semiconductor device, the method comprising:

performing a prior manufacturing process on a wafer;

primarily inspecting the wafer according to the method of claim 17, the substrate including the wafer and the surface; and performing a subsequent manufacturing process on the wafer after the primarily inspecting the wafer.

* * * * *